(12) United States Patent
Kawashima et al.

(10) Patent No.: US 11,935,897 B2
(45) Date of Patent: Mar. 19, 2024

(54) DISPLAY DEVICE AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Naoto Kusumoto, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 18/205,587

(22) Filed: Jun. 5, 2023

(65) Prior Publication Data

US 2023/0317733 A1 Oct. 5, 2023

Related U.S. Application Data

(63) Continuation of application No. 17/507,005, filed on Oct. 21, 2021, now Pat. No. 11,715,740, which is a (Continued)

(30) Foreign Application Priority Data

Nov. 2, 2017 (JP) .................................. 2017-212645

(51) Int. Cl.
*G02F 1/136* (2006.01)
*G02F 1/1362* (2006.01)
*H01L 27/12* (2006.01)

(52) U.S. Cl.
CPC ...... *H01L 27/1225* (2013.01); *G02F 1/13624* (2013.01); *H01L 27/124* (2013.01); *H01L 27/1255* (2013.01)

(58) Field of Classification Search
CPC .................................................. G02F 1/13624
See application file for complete search history.

(56) References Cited

U.S. PATENT DOCUMENTS

| 7,674,650 | B2 | 3/2010 | Akimoto et al. |
| 7,683,860 | B2 | 3/2010 | Nagao et al. |

(Continued)

FOREIGN PATENT DOCUMENTS

| CN | 001591104 A | 3/2005 |
| CN | 001624747 A | 6/2005 |

(Continued)

OTHER PUBLICATIONS

Written Opinion (Application No. PCT/IB2018/058354) dated Feb. 19, 2019.

(Continued)

*Primary Examiner* — Edmond C Lau
(74) *Attorney, Agent, or Firm* — Fish & Richardson P.C.

(57) ABSTRACT

A display device capable of performing proper display without image signal conversion is provided. In the case of high-resolution display, individual data is supplied to each pixel through a first signal line and a first transistor included in each pixel. In the case of low-resolution display, the same data is supplied to a plurality of pixels through a second signal line and a second transistor electrically connected to the plurality of pixels. When the number of image signals to be displayed is more than one and the image signals support different resolutions, display can be performed without up conversion or down conversion by switching an image signal supply path as described above.

3 Claims, 23 Drawing Sheets

Related U.S. Application Data continuation of application No. 16/755,645, filed as application No. PCT/IB2018/058354 on Oct. 26, 2018, now Pat. No. 11,189,643.

(56) References Cited

U.S. PATENT DOCUMENTS

| | | |
|---|---|---|
| 8,681,077 B2 | 3/2014 | Kimura |
| 8,823,610 B2 | 9/2014 | Miyazawa |
| 8,860,108 B2 | 10/2014 | Yamazaki et al. |
| 9,880,437 B2 | 1/2018 | Kusunoki et al. |
| 11,054,710 B2 | 7/2021 | Kusunoki et al. |
| 11,302,278 B2 | 4/2022 | Kawashima et al. |
| 11,335,708 B2 | 5/2022 | Kawashima et al. |
| 11,574,573 B2 | 2/2023 | Yamazaki et al. |
| 2005/0083270 A1 | 4/2005 | Miyazawa |
| 2009/0141204 A1 | 6/2009 | Numao |
| 2015/0144945 A1* | 5/2015 | Kusunoki ......... H01L 29/78696 257/43 |
| 2016/0316159 A1 | 10/2016 | Yoneda |
| 2017/0154579 A1 | 6/2017 | Choi et al. |
| 2020/0097115 A1 | 3/2020 | Nitobe et al. |
| 2020/0119051 A1 | 4/2020 | Umezaki |
| 2020/0194527 A1 | 6/2020 | Kawashima et al. |
| 2021/0233484 A1 | 7/2021 | Koyama et al. |

FOREIGN PATENT DOCUMENTS

| | | |
|---|---|---|
| CN | 001848223 A | 10/2006 |
| CN | 102024410 A | 4/2011 |
| CN | 104867464 A | 8/2015 |
| CN | 106816135 A | 6/2017 |
| EP | 1517290 A | 3/2005 |
| JP | 2005-099715 A | 4/2005 |
| JP | 2005-099773 A | 4/2005 |
| JP | 2007-096055 A | 4/2007 |
| JP | 2008-191450 A | 8/2008 |
| JP | 2011-002845 A | 1/2011 |
| JP | 2011-170133 A | 9/2011 |
| JP | 2013-015765 A | 1/2013 |
| JP | 5462023 | 4/2014 |
| JP | 5782313 | 9/2015 |
| JP | 2015-179250 A | 10/2015 |
| KR | 2005-0021960 A | 3/2005 |
| KR | 2015-0061578 A | 6/2015 |
| KR | 2017-0062636 A | 6/2017 |
| TW | 200517997 | 6/2005 |
| TW | 201530744 | 8/2015 |

OTHER PUBLICATIONS

International Search Report (Application No. PCT/IB2018/058354) dated Feb. 19, 2019.
Chinese Office Action (Application No. 201880068248.8) dated Jan. 11, 2022.

* cited by examiner

FIG. 2A1
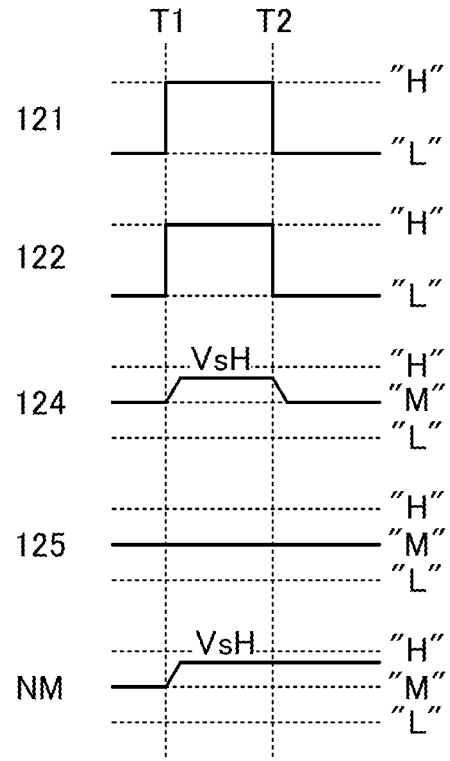
FIG. 2A2
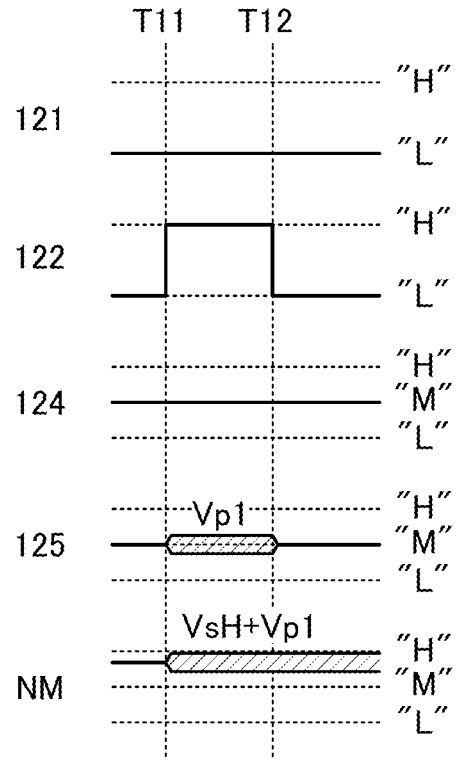
FIG. 2B1
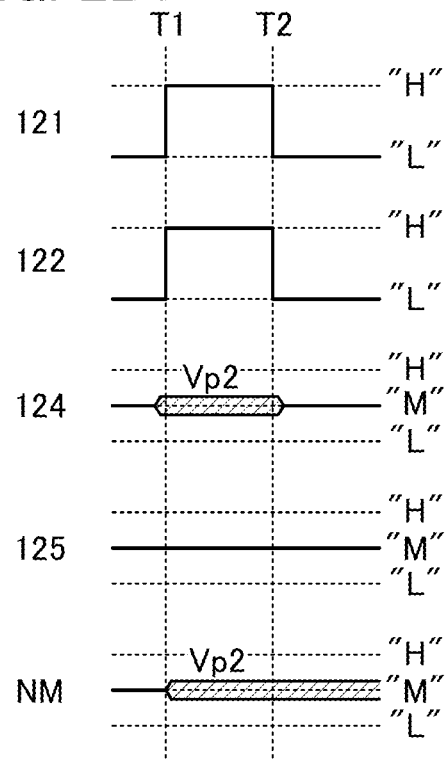
FIG. 2B2
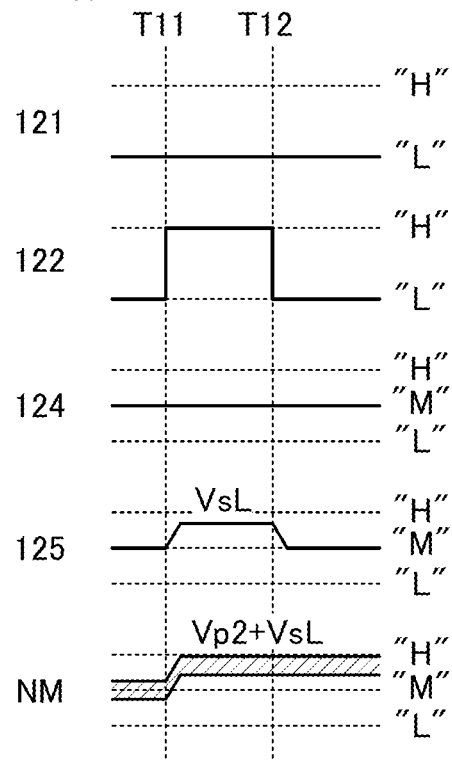

$a = x_1 w_1 + x_2 w_2 + b$

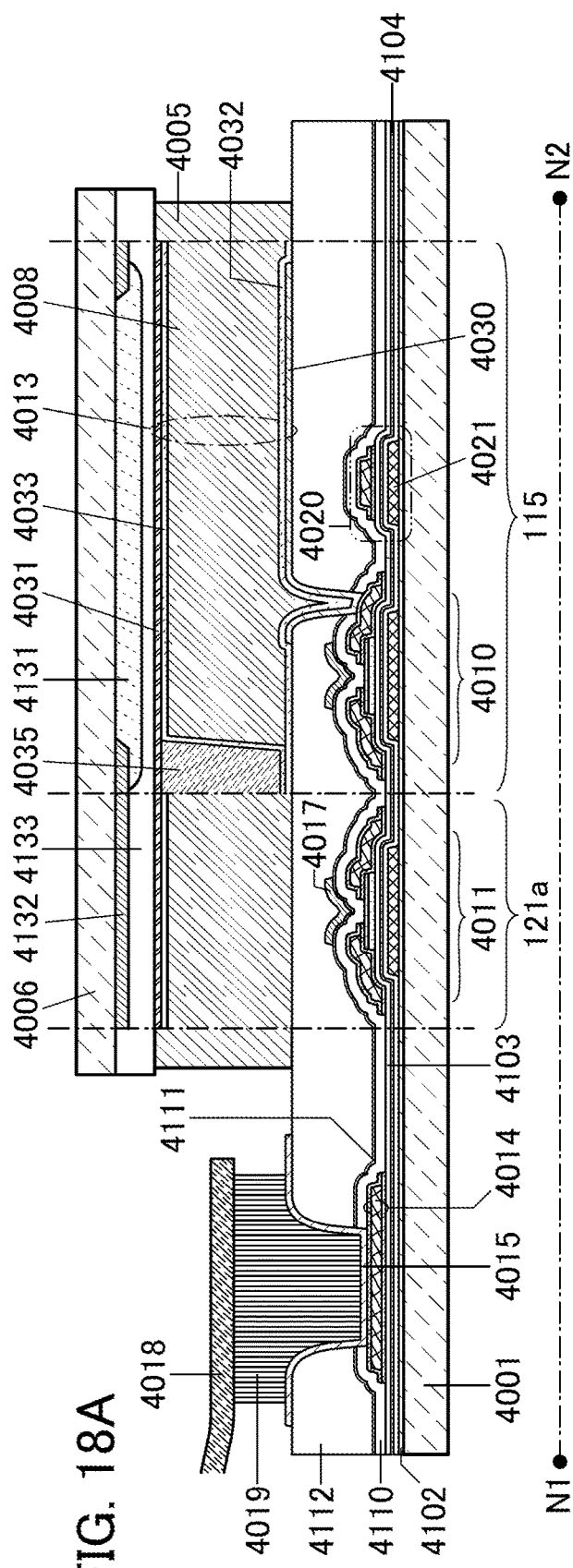
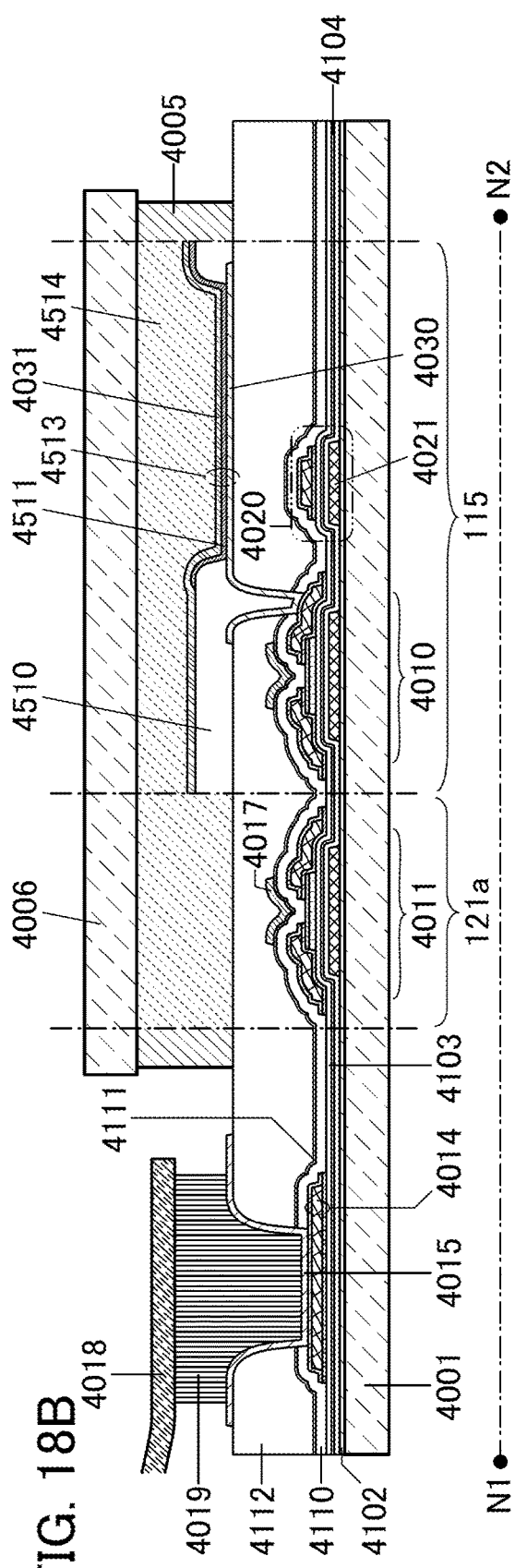
FIG. 18A
FIG. 18B

FIG. 19A1
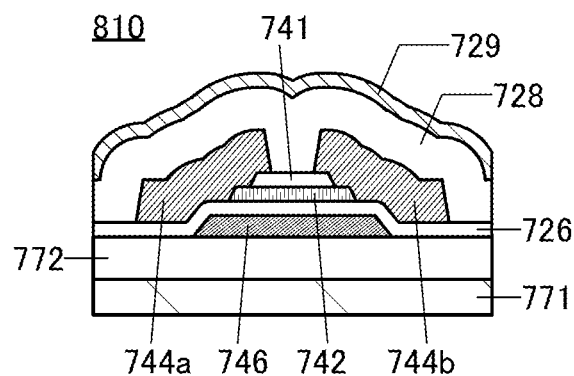
FIG. 19A2
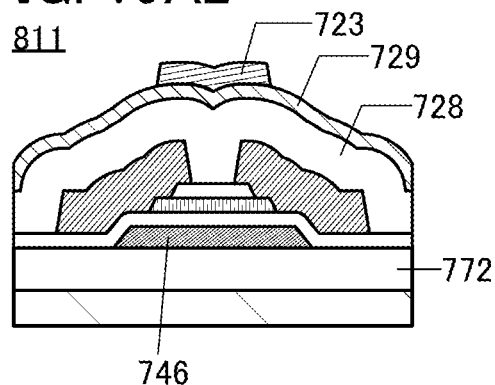
FIG. 19B1
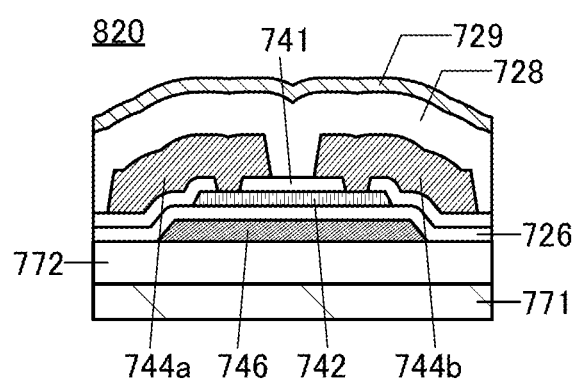
FIG. 19B2
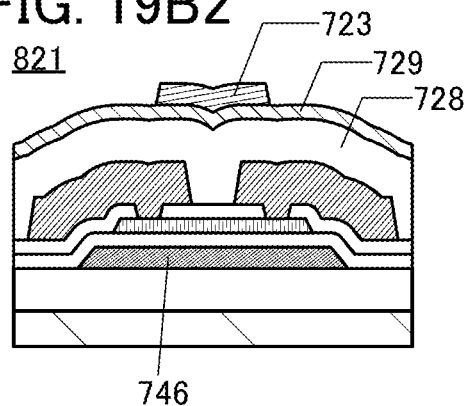
FIG. 19C1
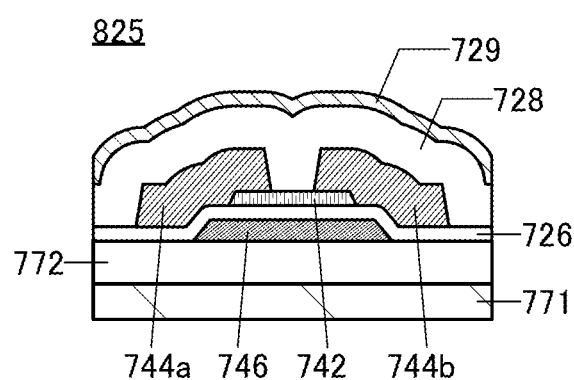
FIG. 19C2
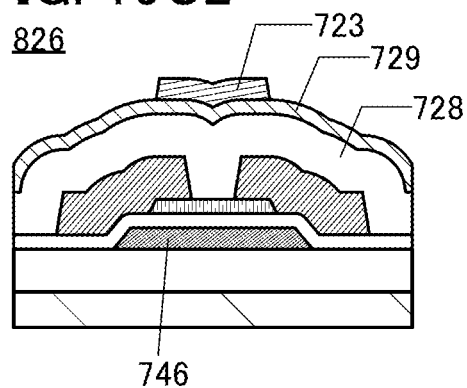

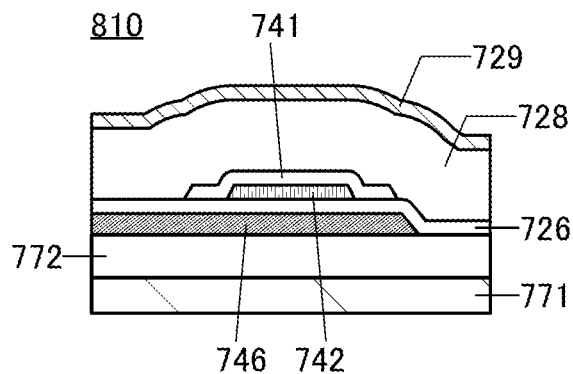
FIG. 20A1
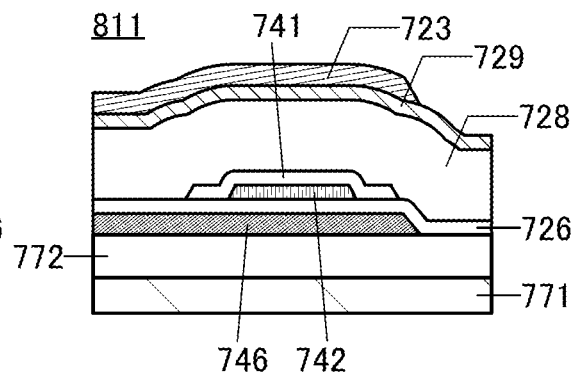
FIG. 20A2
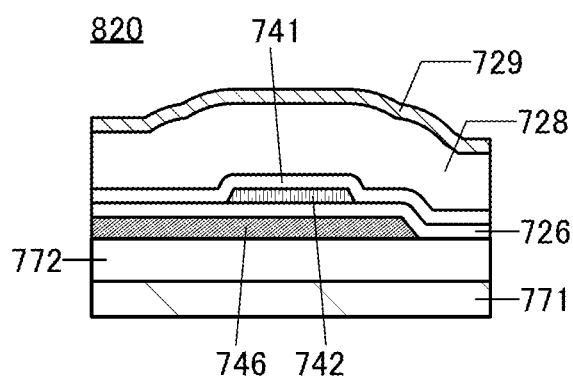
FIG. 20B1
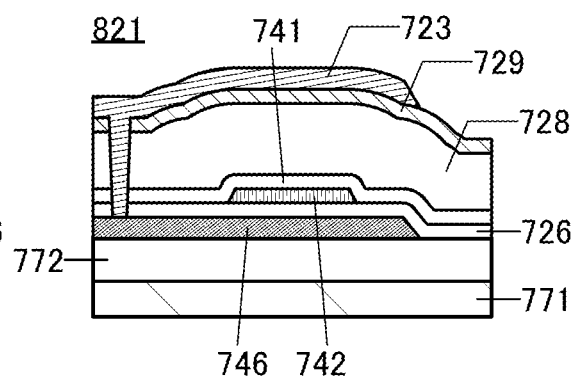
FIG. 20B2
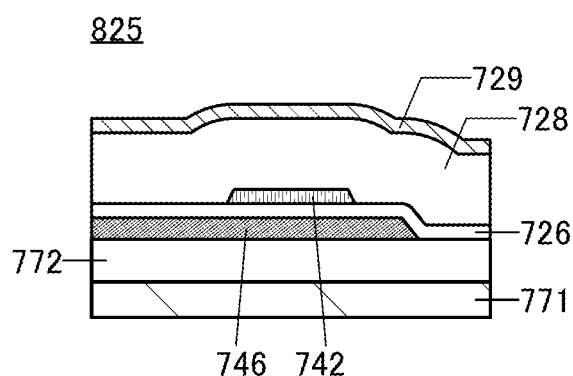
FIG. 20C1
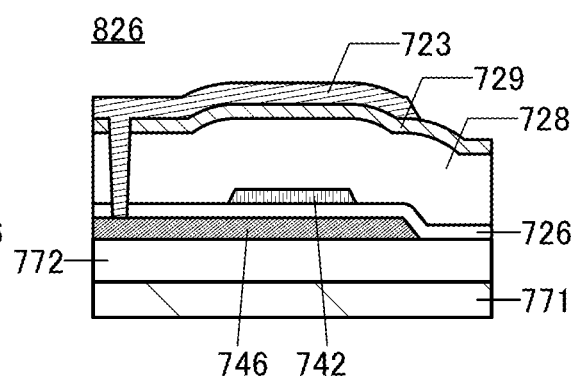
FIG. 20C2

FIG. 21A1
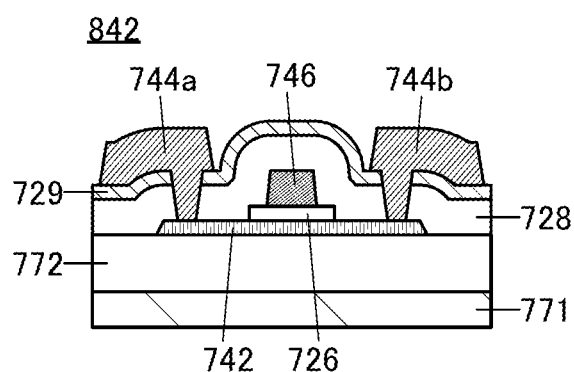
FIG. 21A2
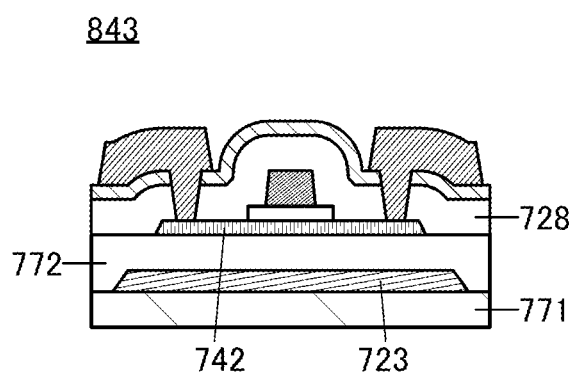
FIG. 21B1
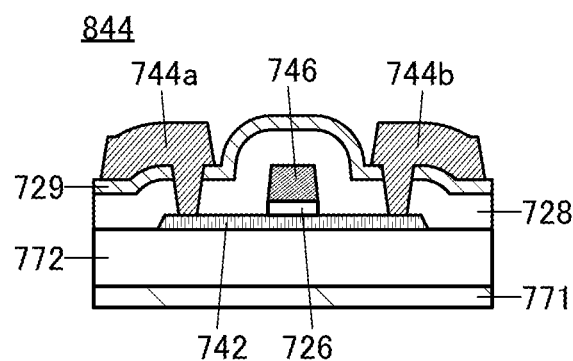
FIG. 21B2
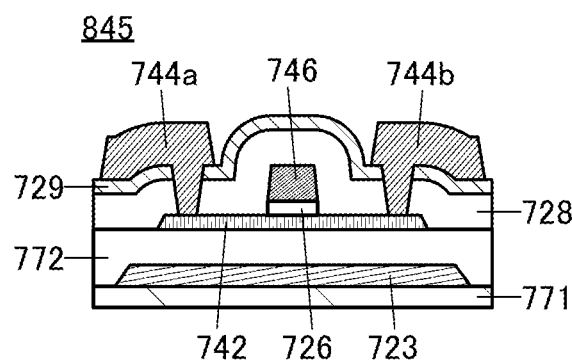
FIG. 21C1
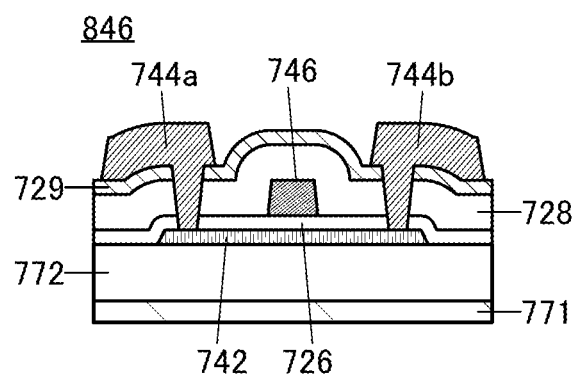
FIG. 21C2
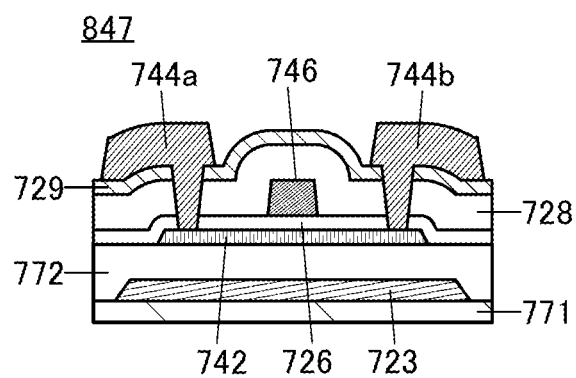

FIG. 22A1
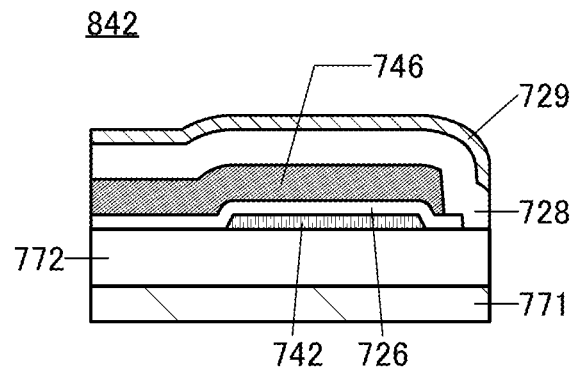
FIG. 22A2
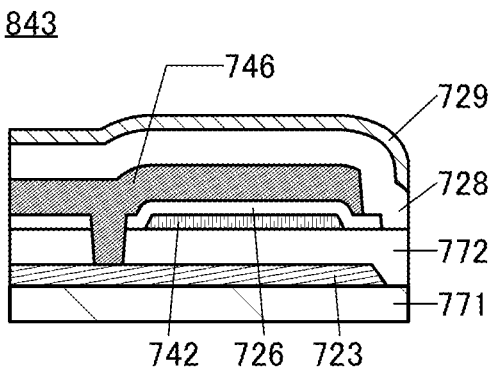
FIG. 22B1
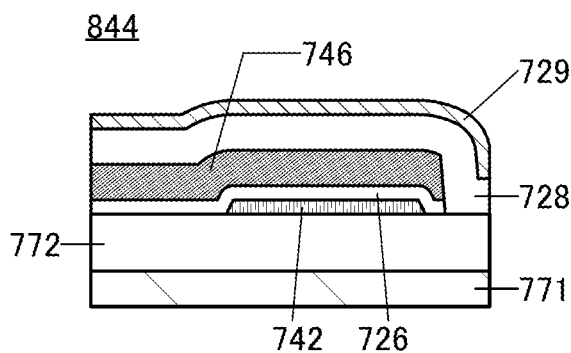
FIG. 22B2
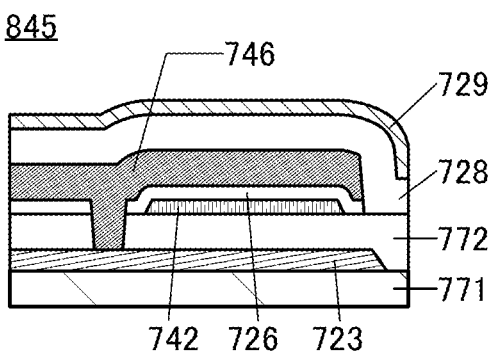
FIG. 22C1
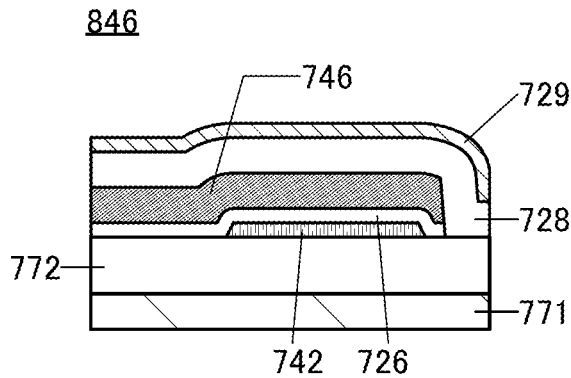
FIG. 22C2
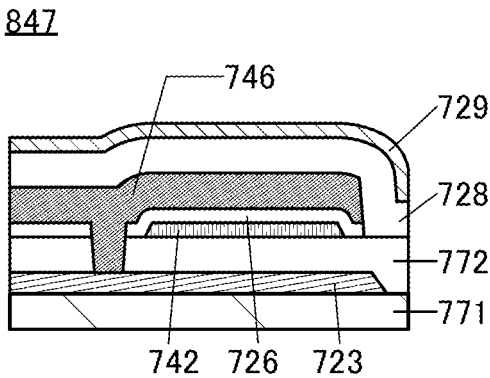

DISPLAY DEVICE AND ELECTRONIC DEVICE

CROSS REFERENCE TO RELATED APPLICATIONS

This application is a continuation of U.S. application Ser. No. 17/507,005, filed Oct. 21, 2021, now allowed, which is incorporated by reference and is a continuation of U.S. application Ser. No. 16/755,645, filed Apr. 13, 2020, now U.S. Pat. No. 11,189,643, which is incorporated by reference and is a U.S. National Phase Application under 35 U.S.C. § 371 of International Application PCT/IB2018/058354, filed on Oct. 26, 2018, which is incorporated by reference and claims the benefit of a foreign priority application filed in Japan on Nov. 2, 2017, as Application No. 2017-212645.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device refers to a device that can function by utilizing semiconductor characteristics in general. A transistor and a semiconductor circuit are embodiments of semiconductor devices. Furthermore, in some cases, a memory device, a display device, an imaging device, or an electronic device includes a semiconductor device.

BACKGROUND ART

A technique for forming a transistor by using a metal oxide formed over a substrate has attracted attention. For example, Patent Document 1 and Patent Document 2 each disclose a technique in which a transistor using zinc oxide or an In—Ga—Zn-based oxide is used as a switching element or the like of a pixel in a display device.

In addition, Patent Document 3 discloses a memory device having a structure in which a transistor with extremely low off-state current is used in a memory cell.

PRIOR ART DOCUMENTS

Patent Documents

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

With the increase in resolution of display devices, hardware capable of performing display with an 8K4K (pixel count: 7680×4320) resolution or higher has been developed. Meanwhile, the amount of high-resolution image data is enormous; thus, peripheral technologies such as an imaging device, a memory device, and a communication device need to be developed as well in order that high-resolution display devices can be widely used.

In addition, for proper display by a display device, it is necessary to adjust image data with the resolution of the display device. In the case where the display device has an 8K4K resolution and the image data is for a 4K2K (pixel count: 3840×2160) resolution, for example, the number of data should be converted by a fourfold increase to perform full-screen display. In contrast, in the case where the display device has the 4K2K resolution and the image data is for the 8K4K resolution, the number of data should be converted into a quarter.

A dedicated circuit is necessary for such conversion of the number of data, which causes a problem of an increase in power consumption. The image data is preferably capable of being input to pixels in the display device without conversion.

In addition, a technique for generating high-resolution image data is up conversion. With up conversion, a low-resolution image can be converted into a pseudo high-resolution image.

However, a device that performs up conversion analyzes an enormous amount of image data and generates new image data; thus, there are problems of increases in circuit scale and power consumption. Moreover, the amount of processing is sometimes too much to handle in real time, causing display delay.

Although up conversion has such problems, the problems of power consumption, delay, and the like are possibly alleviated, for example, when functions related to up conversion are distributed among a plurality of devices.

In view of the above, an object of one embodiment of the present invention is to provide a display device capable of performing proper display without image data conversion. Another object is to provide a display device capable of performing image processing. Another object is to provide a display device capable of performing up conversion operation. Another object is to provide a display device capable of displaying two images superimposed on each other.

Another object is to provide a display device with low power consumption. Another object is to provide a display device with high reliability. Another object is to provide a novel display device or the like. Another object is to provide a method for driving the display device. Another object is to provide a novel semiconductor device or the like.

Note that the description of these objects does not disturb the existence of other objects. Note that in one embodiment of the present invention, there is no need to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention relates to a display device capable of performing proper display without image data conversion. Alternatively, one embodiment of the present invention relates to a display device capable of performing image processing.

One embodiment of the present invention is a display device including a first transistor and a first circuit to a fourth circuit. The first circuit to the fourth circuit each include a second transistor, a first capacitor, and a circuit block. One of a source and a drain of the second transistor is electrically connected to one electrode of the first capacitor. The one electrode of the first capacitor is electrically connected to the circuit block. The other electrode of the first capacitor is electrically connected to one of a source and a drain of the first transistor.

It is preferable that the second transistor include a metal oxide in a channel formation region and that the metal oxide include In, Zn, and M (M is Al, Ti, Ga, Sn, Y, Zr, La, Ce, Nd, or Hf).

A gate of the second transistor included in the first circuit can be electrically connected to a gate of the second transistor included in the second circuit. A gate of the second transistor included in the third circuit can be electrically connected to a gate of the second transistor included in the fourth circuit.

In addition, the other of the source and the drain of the second transistor included in the first circuit can be electrically connected to the other of the source and the drain of the second transistor included in the third circuit. The other of the source and the drain of the second transistor included in the second circuit can be electrically connected to the other of the source and the drain of the second transistor included in the fourth circuit.

The first circuit to the fourth circuit each have a function of pixels arranged in a matrix. The first circuit can be provided in an n-th row and an i-th column (each of n and i is a natural number). The second circuit can be provided in the n-th row and an (i+x)th column (x is a natural number). The third circuit can be provided in an (n+1)th row and the i-th column. The fourth circuit can be provided in the (n+1)th row and the (i+x)th column.

The circuit block includes a third transistor, a fourth transistor, a second capacitor, and an organic EL element, and can have the following structure. One electrode of the organic EL element is electrically connected to one of a source and a drain of the fourth transistor. The other of the source and the drain of the fourth transistor is electrically connected to one electrode of the second capacitor. The one electrode of the second capacitor is electrically connected to one of a source and a drain of the third transistor. A gate of the third transistor is electrically connected to the other electrode of the second capacitor. The other electrode of the second capacitor is electrically connected to the one electrode of the first capacitor.

In the above structure, the display device may further include a fifth transistor and a fifth circuit, and may have the following structure. One of a source and a drain of the fifth transistor is electrically connected to the other of the source and the drain of the fourth transistor. The other of the source and the drain of the fifth transistor is electrically connected to the fifth circuit.

The fifth circuit can have a function of supplying a constant potential. Alternatively, the fifth circuit can have a function of reading a current value and generating correction data.

In addition, the circuit block may include a sixth transistor, a third capacitor, and a liquid crystal element, and may have the following structure. One electrode of the liquid crystal element is electrically connected to one electrode of the capacitor. The one electrode of the capacitor is electrically connected to one of a source and a drain of the sixth transistor. The other of the source and the drain of the sixth transistor is electrically connected to the one electrode of the first capacitor.

It is preferable that the sixth transistor include a metal oxide in a channel formation region and that the metal oxide include In, Zn, and M (M is Al, Ti, Ga, Sn, Y, Zr, La, Ce, Nd, or Hf).

In addition, another embodiment of the present invention is a display device including a first transistor, a first circuit, a second circuit, a third circuit, a first wiring, a second wiring, and a third wiring. The first circuit to the third circuit each include a second transistor, a first capacitor, and a display element. One of a source and a drain of the second transistor is electrically connected to one electrode of the first capacitor. The one electrode of the first capacitor is electrically connected to the display element. The first circuit to the third circuit are provided to be sequentially next to each other in one direction. The first wiring is provided between the first circuit and the second circuit. The second wiring and the third wiring are provided between the second circuit and the third circuit. The first wiring is electrically connected to the other of the source and the drain of the second transistor included in the second circuit. The second wiring is electrically connected to the other of the source and the drain of the second transistor included in the third circuit. The third wiring is electrically connected to one of a source and a drain of the first transistor. The other of the source and the drain of the first transistor is electrically connected to the other electrode of the first capacitor included in any of the first circuit to the third circuit.

In addition, another embodiment of the present invention is a display device including a first transistor, a first circuit, a second circuit, a third circuit, a first wiring, a second wiring, a third wiring, and a fourth wiring. The first circuit to the third circuit each include a second transistor, a first capacitor, a second capacitor, and a display element. One of a source and a drain of the second transistor is electrically connected to one electrode of the first capacitor. The one electrode of the first capacitor is electrically connected to one electrode of the second capacitor. The one electrode of the second capacitor is electrically connected to the display element. The first circuit to the third circuit are provided to be sequentially next to each other in one direction. The first wiring and the second wiring are provided between the first circuit and the second circuit. The third wiring and the fourth wiring are provided between the second circuit and the third circuit. The first wiring is electrically connected to the other of the source and the drain of the second transistor included in the second circuit. The second wiring is electrically connected to the other of the second capacitor included in the first circuit. The second wiring is electrically connected to the other of the second capacitor included in the second circuit. The third wiring is electrically connected to the other of the source and the drain of the second transistor included in the third circuit. The fourth wiring is electrically connected to one of a source and a drain of the first transistor. The other of the source and the drain of the first transistor is electrically connected to the other electrode of the first capacitor included in any of the first circuit to the third circuit.

Effects of the Invention

With one embodiment of the present invention, a display device capable of performing proper display without image data conversion can be provided. Alternatively, a display device capable of performing image processing can be provided. Alternatively, a display device capable of performing up conversion operation can be provided. Alternatively, a display device capable of displaying two images superimposed on each other can be provided.

Alternatively, a display device with low power consumption can be provided. Alternatively, a display device with high reliability can be provided. Alternatively, a novel display device or the like can be provided. Alternatively, a method for driving the display device can be provided. Alternatively, a novel semiconductor device or the like can be provided.

BRIEF DESCRIPTION OF THE DRAWINGS

FIGS. 2A1, 2A2, 2B1, and 2B2 Timing charts each illustrating operation of a pixel circuit.

FIGS. 18A and 18B Diagrams illustrating display devices.

FIGS. 19A1, 19A2, 19B1, 19B2, 19C1, and 19C2 Diagrams illustrating transistors.

FIGS. 20A1, 20A2, 20B1, 20B2, 20C1, and 20C2 Diagrams illustrating transistors.

FIGS. 21A1, 21A2, 21B1, 21B2, 21C1, and 21C2 Diagrams illustrating transistors.

FIGS. 22A1, 22A2, 22B1, 22B2, 22C1, and 22C2 Diagrams illustrating transistors.

MODE FOR CARRYING OUT THE INVENTION

Figure 1:
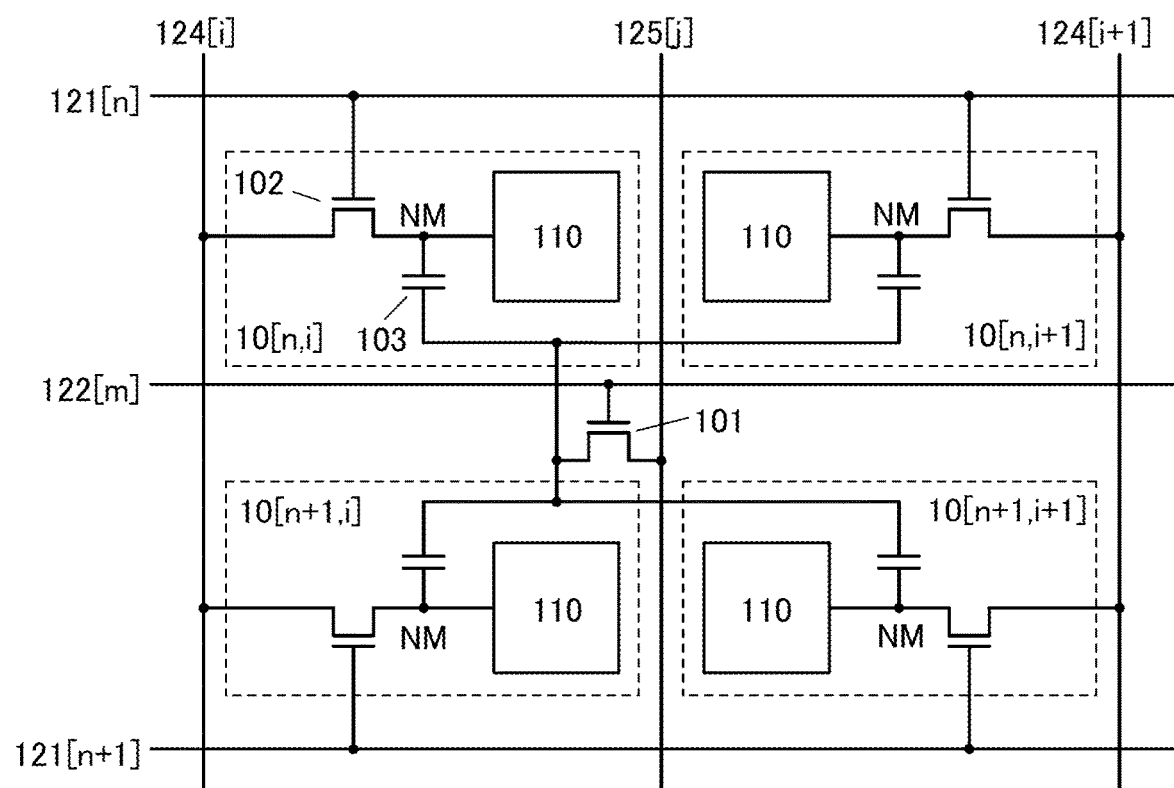
FIG. 1 A diagram illustrating a pixel circuit.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and repeated description thereof is omitted in some cases. Note that the hatching of the same component that constitutes a drawing is omitted or changed as appropriate in different drawings in some cases.

Embodiment 1

In this embodiment, a display device that is one embodiment of the present invention is described with reference to drawings.

One embodiment of the present invention is a display device capable of performing proper display without up conversion or down conversion of two image data for a high resolution and a low resolution. In the case of high-resolution display, individual data is supplied to each pixel through a first data line and a first transistor included in each pixel. In the case of low-resolution display, the same data is supplied to a plurality of pixels through a second data line and a second transistor electrically connected to the plurality of pixels.

When the number of image data to be displayed is more than one and the image data support different resolutions, display can be performed without up conversion or down conversion by switching an image data supply path as described above.

Here, the image data for a high resolution corresponds to, for example, data for 8K4K (pixel count: 7680×4320). In addition, the image data for a low resolution corresponds to, for example, data with the data amount for 4K2K (pixel count: 3840×2160). In other words, it is assumed that the ratio of the number of effective image data (corresponding to the number of effective pixels) for a high resolution to the number of effective image data for a low resolution is 4:1.

Note that the image data for a high resolution and the image data for a low resolution are not limited to the above example as long as the ratio between the number of data (pixel count) is 4:1. The image data for a high resolution may be data for 4K2K, and the image data for a low resolution may be data for FullHD (pixel count: 1920×1080). Alternatively, the image data for a high resolution may be data for 16K8K (pixel count: 15360×8640), and the image data for a low resolution may be data for 8K4K.

A storage node is provided in each pixel, and first data can be retained in the storage node. The first data is generated in an external device and can be written to each pixel. The first data is added to second data by capacitive coupling and can be supplied to a display element. Alternatively, the first data can be added by capacitive coupling after the second data is written to the storage node.

Thus, a correction image can be displayed with the display element. The correction enables up conversion of an image in a pixel even when the low-resolution display is performed. Alternatively, display with a wide dynamic range can be performed by correction of part or the whole of an image in a display region. Alternatively, given images superimposed on each other can be displayed when different image data are used as the first data and the second data.

FIG. 1 illustrates part of a pixel array (four pixels) arranged in a matrix in a display device of one embodiment of the present invention. A transistor 102, a capacitor 103, and a circuit block 110 are provided in one pixel 10. The circuit block 110 can include a transistor, a capacitor, a display element, and the like and will be described in detail later. Note that in parentheses attached to reference numerals, n and m each denote a certain row and i and j each denote a certain column.

The pixels 10 are arranged in a matrix, and can be provided in an n-th row and an i-th column (each of n and i is a natural number of 1 or more), in the n-th row and an (i+x)th column (x is a natural number of 1 or more), in an (n+1)th row and the i-th column, and in the (n+1)th row and the (i+x)th column. Note that FIG. 1 illustrates arrangement where x is 1.

In addition, a transistor 101 that is electrically connected to four pixels 10 is provided in the pixel array. The transistor 101 is provided in an m-th row and a j-th column (each of m and j is a natural number of 1 or more) with arrangement different from that of the pixels 10. Here, the m-th row is preferably provided between the n-th row and the (n+1)th row. Furthermore, a J-th column is preferably provided between the i-th column and the (i+x)th column. Note that the transistor 101 is a component of each pixel 10, and the transistor 101 can be regarded as being shared by the pixels.

One of a source and a drain of the transistor 102 is electrically connected to one electrode of the capacitor 103. The one electrode of the capacitor 103 is electrically connected to the circuit block 110. The other electrode of the capacitor 103 is electrically connected to one of a source and a drain of the transistor 101.

Here, a wiring to which the one of the source and the drain of the transistor 102, the one electrode of the capacitor 103, and the circuit block are connected is referred to as a node NM. Note that a component of the circuit block 110 that is connected to the node NM can bring the node NM into a floating state.

A gate of the transistor 102 is electrically connected to a wiring 121. A gate of the transistor 101 is electrically connected to a wiring 122. The other of the source and the drain of the transistor 102 is electrically connected to a wiring 124. The other of the source and the drain of the transistor 101 is electrically connected to a wiring 125.

The wirings 121 and 122 can each have a function of a signal line for controlling the transistor operation. The wirings 124 and 125 can each have a function of a signal line for supplying image data or correction data. In addition, the wiring 124 can also be referred to as a signal line for writing data to the node NM.

The node NM is a storage node, and data supplied to the wiring 124 can be written to the node NM when the transistor 102 is brought into conduction. The use of a transistor with extremely low off-state current as the transistor 102 enables long-term retention of the potential of the node NM. A transistor using a metal oxide in a channel formation region (hereinafter, referred to as an OS transistor) can be used as the transistor, for example.

Note that an OS transistor may be employed as another transistor included in the pixel as well as the transistor 102. A transistor containing Si in a channel formation region (hereinafter, referred to as a Si transistor) may also be employed as the transistor 102. Alternatively, both an OS transistor and a Si transistor may be used. Note that examples of the Si transistor include a transistor containing amorphous silicon and a transistor containing crystalline silicon (typically, low-temperature polysilicon or single crystal silicon).

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS, a CAC-OS, or the like described later can be used, for example. A CAAC-OS is suitable for a transistor or the like that emphasizes reliability because atoms contained in crystals are stable. In addition, a CAC-OS is suitable for a transistor or the like that is driven at high speed because a transistor or the like using a CAC-OS exhibits high mobility characteristics.

An OS transistor has a large energy gap and thus exhibits extremely low off-state current characteristics. In addition, an OS transistor has features such that impact ionization, an avalanche breakdown, a short-channel effect, and the like do not occur, which are different from those of a Si transistor, and can configure a highly reliable circuit.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that constitutes the semiconductor layer is an In-M-Zn-based oxide, it is preferable that the atomic ratio of metal elements in a sputtering target used to deposit an In-M-Zn oxide satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements in the sputtering targets in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be regarded as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set to lower than or equal to $2\times10^{18}$ atoms/$cm^3$, preferably lower than or equal to $2\times10^{17}$ atoms/$cm^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set to lower than or equal to $1\times10^{18}$ atoms/$cm^3$, preferably lower than or equal to $2\times10^{16}$ atoms/$cm^3$.

Furthermore, when nitrogen is contained in the oxide semiconductor that constitutes the semiconductor layer, electrons serving as carriers are generated and the carrier density is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set to lower than or equal to $5\times10^{18}$ atoms/cm$^3$.

Moreover, the semiconductor layer may have a non-single-crystal structure, for example. The non-single-crystal structure includes, for example, a CAAC-OS (C Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

The composition of a CAC (Cloud-Aligned Composite)-OS, which is one embodiment of a non-single-crystal semiconductor layer, is described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current ($I_{on}$) and high field-effect mobility ($\mu$) can be achieved.

Moreover, a semiconductor element using the CAC-OS has high reliability. Thus, the CAC-OS is suitable for a constituent material in a variety of semiconductor devices.

First, an operation example in which different data are written to pixels 10 is described with reference to timing charts illustrated in FIGS. 2(A1) and 2(A2). This operation corresponds to, for example, the case where image data for a high resolution (8K4K data) is input to a display device whose pixel count corresponds to 8K4K. Although the operation for one pixel 10 will be described, similar operation can be applied to the other pixels 10.

In the following description, "H" represents a high potential, "L" represents a low potential, and "M" represents a certain potential between the high potential and the low potential. Note that "M" can be, for example, a reference potential such as 0 V or GND but may be another potential. In addition, "VsH" represents image data for a high resolution, and "Vp1" represents correction data for a high resolution. Note that "VsH" can also represent first given data, and "Vp1" can also represent second given data.

First, the operation of writing image data (VsH) to the node NM is described with reference to FIG. 2(A1). Note that in potential distribution, potential coupling, or potential loss, detailed changes due to a circuit configuration, operation timing, or the like are not considered. In addition, a potential change due to capacitive coupling depends on the ratio of the capacitance of a potential supplier to that of a potential receiver; however, for clarity, the capacitance value of the node NM is assumed to be sufficiently small.

At time T1, the potential of the wiring 121 is set to "H," the potential of the wiring 122 is set to "H," the potential of the wiring 124 is set to "VsH," and the potential of the wiring 125 is set to "M," so that the transistor 101 is brought into conduction and the potential of the other electrode of the capacitor 103 becomes "M." This operation is reset operation for later correction operation (capacitive coupling operation).

In addition, the transistor 102 is brought into conduction, and the potential of the wiring 124 (image data "VsH") is written to the node NM.

At time T2, the potential of the wiring 121 is set to "L," the potential of the wiring 122 is set to "L," the potential of the wiring 124 is set to "M," and the potential of the wiring 125 is set to "M," so that the transistor 101 and the transistor 102 are brought out of conduction and the image data "VsH" is retained in the node NM.

The operation of writing the image data "VsH" has been described so far. Next, the operation of correcting the image data "VsH" and the display operation of the display element included in the circuit block 110 are described with reference to FIG. 2(A2).

The operations in FIGS. 2(A1) and 2(A2) can be sequentially performed in one horizontal period. Alternatively, the operation in FIG. 2(A1) may be performed in a k-th frame (k is a natural number), and the operation in FIG. 2(A2) may be performed in a (k+1)th frame.

At time T11, the potential of the wiring 121 is set to "L," the potential of the wiring 122 is set to "H," the potential of the wiring 124 is set to "M," and the potential of the wiring 125 is set to "Vp1," so that the transistor 101 is brought into conduction and the potential "Vp1" of the wiring 125 is added to the potential of the node NM by capacitive coupling of the capacitor 103. Here, "Vp1" is the correction data, and the node NM has a potential "VsH+Vp1" where the correction data "Vp1" is added to the image data "VsH."

At time T12, the potential of the wiring 121 is set to "L," the potential of the wiring 122 is set to "L," the potential of the wiring 124 is set to "M," and the potential of the wiring 125 is set to "M," so that the transistor 101 is brought out of conduction and the potential of the node NM is retained at "VsH+Vp1."

After that, the display element included in the circuit block 110 performs the display operation in accordance with the potential of the node NM. Note that depending on the configuration of the circuit block, the display operation might start at time T1 or time T11.

An image with a wide dynamic range can be displayed by performing correction in a pixel selected in this manner. Note that the value of the correction data "Vp1" is the same for each of four pixels, which is sufficiently effective in obtaining a visual contrast effect. In the case where the correction is not performed, the potential of the wiring 125 may be kept at "M" at time T11. Alternatively, the potential of the wiring 122 may be set to "L" so that the transistor 101 is not brought into conduction.

Next, the operation of writing the same data to the four pixels 10 is described with reference to timing charts illustrated in FIGS. 2(B1) and 2(B2). This operation corresponds to, for example, the case where image data for a low resolution (4K2K data) is input to a display device whose pixel count corresponds to 8K4K.

First, the operation of writing correction data (Vp2) to the node NM is described with reference to FIG. 2(B1). In the following description, "VsL" represents image data for a low resolution, and "Vp2" represents correction data for a low resolution. Note that "VsL" can also represent first given data, and "Vp2" can also represent second given data.

At time T1, the potential of the wiring 121 is set to "H," the potential of the wiring 122 is set to "H," the potential of the wiring 124 is set to "Vp2," and the potential of the wiring 125 is set to "M," so that the transistor 101 is brought into conduction and the potential of the other electrode of the capacitor 103 becomes "M." This operation is reset operation for later correction operation (capacitive coupling operation).

In addition, the transistor 102 is brought into conduction, and the potential of the wiring 124 (correction data "Vp2") is written to the node NM.

At time T2, the potential of the wiring 121 is set to "L," the potential of the wiring 122 is set to "L," the potential of the wiring 124 is set to "M," and the potential of the wiring 125 is set to "M," so that the transistor 101 and the transistor 102 are brought out of conduction and the correction data "Vp2" is retained in the node NM.

The operation of writing the correction data "Vp2" has been described so far. Next, the operation of correcting the image data "VsL" and the display operation of the display element included in the circuit block 110 are described with reference to FIG. 2(B2).

The operations in FIGS. 2(B1) and 2(B2) can be sequentially performed in one horizontal period. Alternatively, the operation in FIG. 2(B1) may be performed in the k-th frame, and the operation in FIG. 2(B2) may be performed in the (k+1)th frame.

At time T11, the potential of the wiring 121 is set to "L," the potential of the wiring 122 is set to "H," the potential of the wiring 124 is set to "M," and the potential of the wiring 125 is set to "VsL," so that the transistor 101 is brought into conduction and the potential "VsL" of the wiring 125 is added to the potential of the node NM owing to the capacitive coupling of the capacitor 103. Here, "VsL" is the image data, and the node NM has a potential "Vp2+VsL" where the image data "VsL" is added to the correction data "Vp2."

At time T12, the potential of the wiring 121 is set to "L," the potential of the wiring 122 is set to "L," the potential of the wiring 124 is set to "M," and the potential of the wiring 125 is set to "M," so that the transistor 101 is brought out of conduction and the potential of the node NM is retained at "Vp2+VsL."

After that, the display element included in the circuit block 110 performs the display operation in accordance with the potential of the node NM. Note that depending on the configuration of the circuit block, the display operation might start at time T11.

As the correction data "Vp2," a different value can be input to each pixel 10. Thus, even with the same image data "VsL," each pixel 10 can perform different display. That is, up conversion can be performed. Note that in the case where the correction is not performed, the potential of the wiring 124 may be kept at "M" at time T1. Alternatively, the potential of the wiring 125 may be kept at "M" at time T11. Alternatively, the potential of the wiring 122 may be set to "L" so that the transistor 101 is not brought into conduction. In the case where the correction is not performed, the same image can be displayed in four pixels.

Through the above operation, original image data can be input to the display device without being up-converted or down-converted, so that proper display can be performed. In addition, correction appropriate for image display can be performed.

Here, up conversion operation when image data for a low resolution is input is described with reference to FIGS. 3(A) and 3(B).

For example, the pixel count of an 8K4K display device is four times as large as the pixel count of a 4K2K display device. That is, when image data that is displayed in one pixel of a 4K2K display device is to be simply displayed on an 8K4K display device, the same image data is displayed in four pixels in horizontal and vertical directions.

Figure 3A:
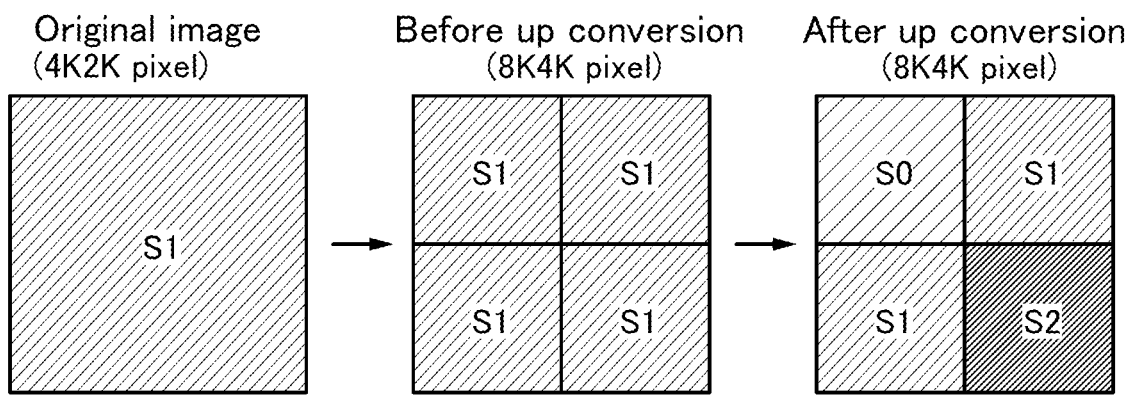
FIGS. 3A and 3B Diagrams illustrating up conversion.

FIG. 3(A) is a diagram illustrating images with and without up conversion. From the left, a diagram illustrating an original image (image data S1) displayed on one pixel in a 4K2K display device, a diagram illustrating the image data S1 without up conversion displayed on four pixels in an 8K4K display device, and a diagram illustrating image data S0 to S2 with up conversion displayed on the four pixels in the 8K4K display device are shown.

As shown in FIG. 3(A), the image data S1 is displayed on all the four pixels before up conversion, whereas the image data S0 to S2 are applied to the pixels after up conversion, resulting in an increase in resolution.

Figure 3B:
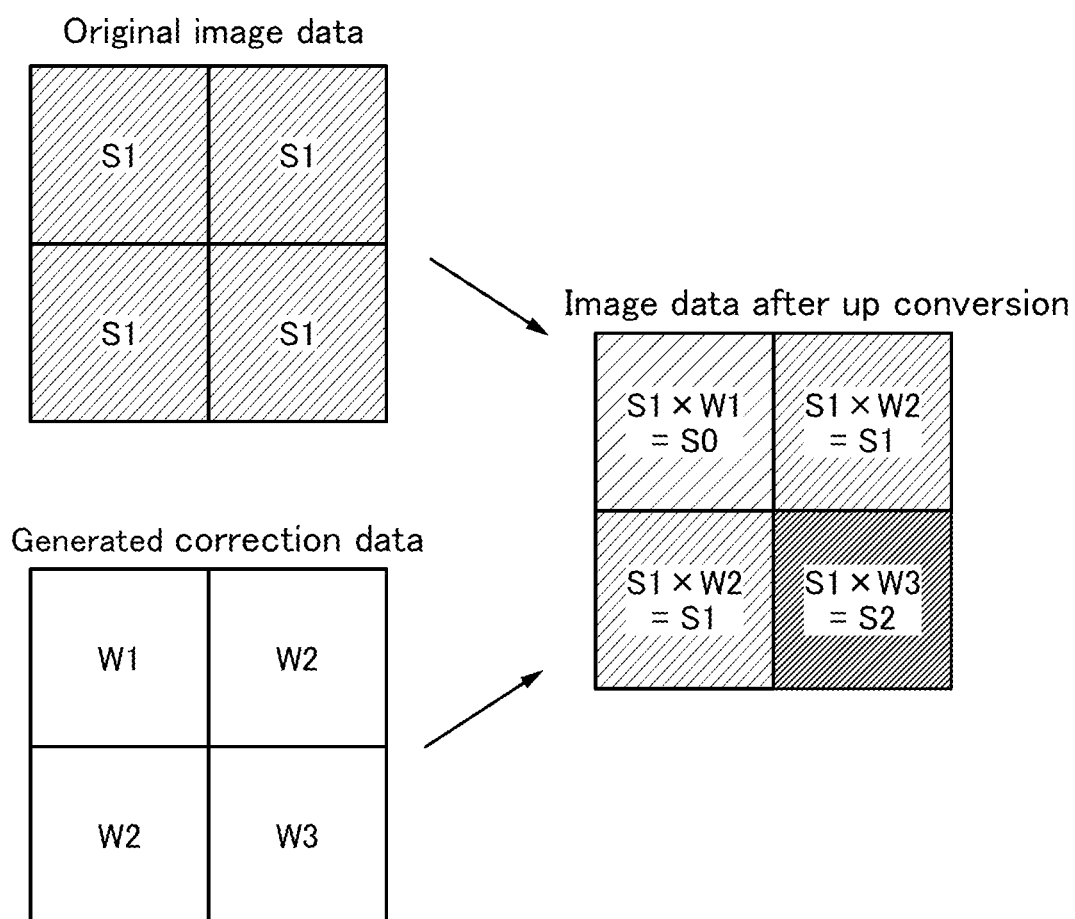

FIG. 3(B) is a diagram illustrating the up conversion operation in the pixel 10. In the pixel 10, given correction data can be added to image data as described above. Therefore, the original image data S1 is supplied to each pixel as it is.

Moreover, correction data W1 to W3 are supplied to the pixels. Here, there is no particular limitation on a method for generating W1 to W3. The correction data may be generated in real time using an external device, or correction data stored in a memory medium may be read out and synchronized with the image data S1.

Then, the operation of the pixel 10 is performed, so that each correction data (W1, W2, or W3) is added to the image data S1 supplied to each pixel and the new image data S0 to S2 are generated. Consequently, the up-converted original image data S1 can be displayed.

In conventional up conversion with external correction, a heavy load is put on an external device because new image data itself is generated. In contrast, in one embodiment of the present invention described above, image data to be supplied is not changed, and new image data is generated in a pixel supplied with correction data; thus, a load on an external device can be small. Moreover, the operation for generating new image data in a pixel can be performed in a small number of steps and thus can be performed even in a display device with a large number of pixels and a short horizontal period.

Note that although the above description is made using up conversion as an example, the operation can be applied to every operation for adding two image data and displaying the added image data. For example, the operation may be applied to operation for displaying a character image superimposed on a certain image. Alternatively, the operation may be applied to operation for superimposing different images on each other.

Figure 4A:
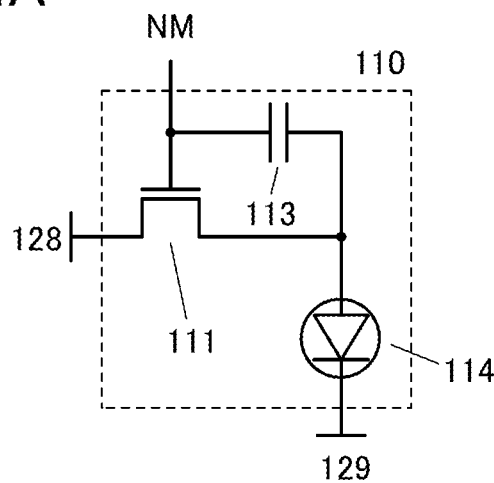
FIGS. 4A to 4C Diagrams illustrating circuit blocks.
Figure 4B:
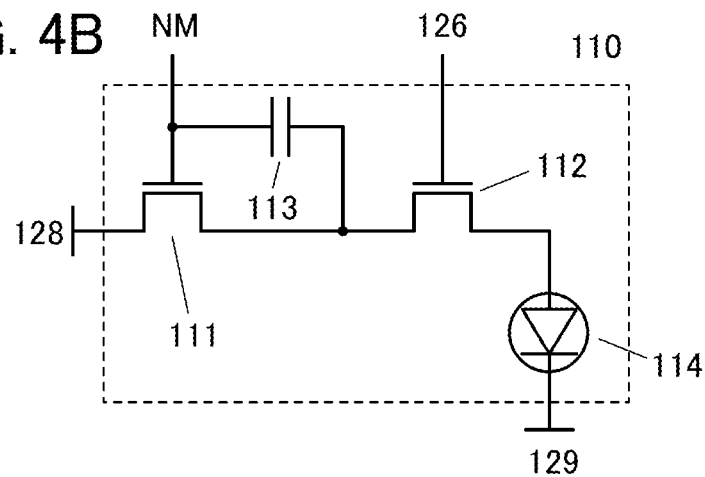
Figure 4C:
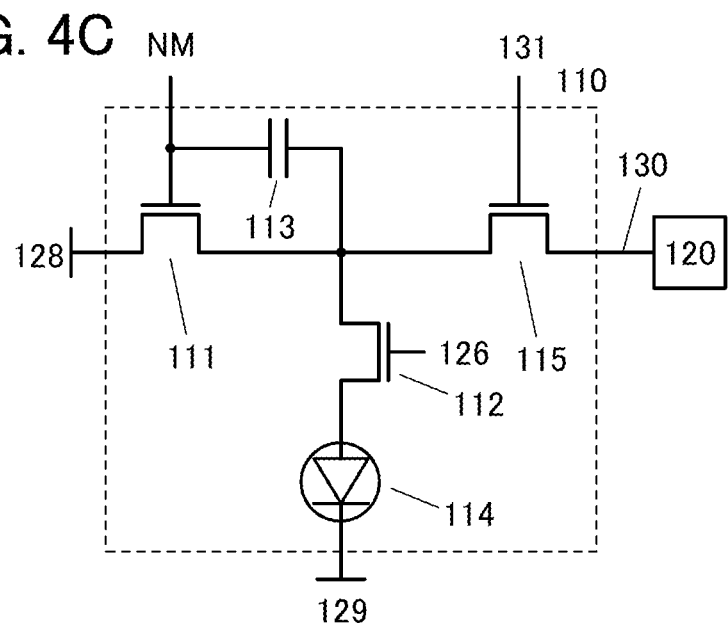

FIGS. 4(A) to 4(C) are examples of a structure including an EL element as the display element, which can be applied to the circuit block 110.

The structure illustrated in FIG. 4(A) includes a transistor 111, a capacitor 113, and an EL element 114. One of a source and a drain of the transistor 111 is electrically connected to one electrode of the EL element 114. The one electrode of the EL element 114 is electrically connected to one electrode of the capacitor 113. The other electrode of the capacitor 113 is electrically connected to a gate of the transistor 111. The gate of the transistor 111 is electrically connected to the node NM.

The other of the source and the drain of the transistor 111 is electrically connected to a wiring 128. The other electrode of the EL element 114 is electrically connected to a wiring 129. The wirings 128 and 129 each have a function of supplying power. For example, the wiring 128 can supply a high power supply potential. In addition, the wiring 129 can supply a low power supply potential.

In the structure, current flows through the EL element 114 when the potential of the node NM becomes equal to or higher than the threshold voltage of the transistor 111. Therefore, in some cases, the EL element 114 starts to emit light at time T1 in the timing charts illustrated in FIGS. 2(A1) and 2(B1), and it is preferable to use the structure for operation that requires no correction.

FIG. 4(B) is a structure in which a transistor 112 is added to the structure in FIG. 4(A). One of a source and a drain of the transistor 112 is electrically connected to the one of the source and the drain of the transistor 111. The other of the source and the drain of the transistor 112 is electrically connected to the EL element 114. A gate of the transistor 112 is electrically connected to a wiring 126. The wiring 126 can have a function of a signal line that controls the conduction of the transistor 112.

In the structure, current flows through the EL element 114 in accordance with the conduction of the transistor 112 regardless of the potential of the node NM. Therefore, the EL element 114 can start to emit light at or after time T12 in the timing charts illustrated in FIGS. 2(A2) and 2(B2), which is suitable for operation that requires correction.

FIG. 4(C) is a structure in which a transistor 115 is added to the structure in FIG. 4(B). One of a source and a drain of the transistor 115 is electrically connected to the one of the source and the drain of the transistor 111. The other of the source and the drain of the transistor 115 is electrically connected to a wiring 130. A gate of the transistor 115 is electrically connected to a wiring 131. The wiring 131 can have a function of a signal line that controls the conduction of the transistor 115. Note that the gate of the transistor 115 may be electrically connected to the wiring 122.

The wiring 130 can be connected to a circuit 120 and has a function of a monitor line for obtaining the electrical characteristics of the transistor 111. In addition, supplying a specific potential from the wiring 130 to the one of the source and the drain of the transistor 111 through the transistor 115 can also stabilize image data writing.

In the case where the wiring 130 functions as a monitor line, the circuit 120 can generate a potential for correcting the threshold voltage of the transistor 111 as the correction data (Vp2).

Figure 5A:
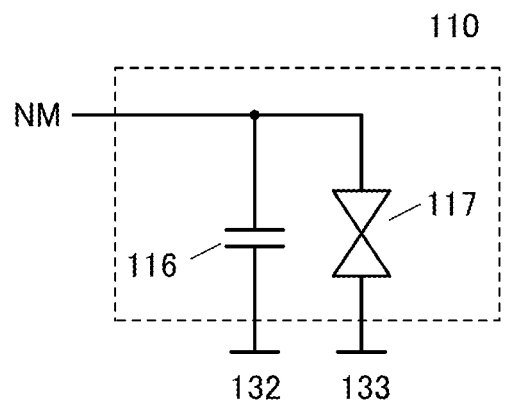
FIGS. 5A to 5C Diagrams illustrating circuit blocks.
Figure 5B:
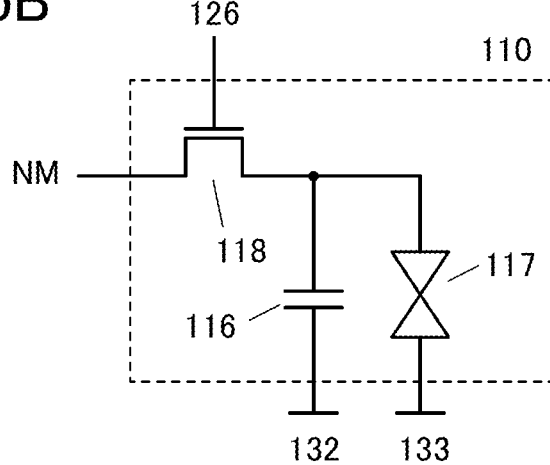
Figure 5C:
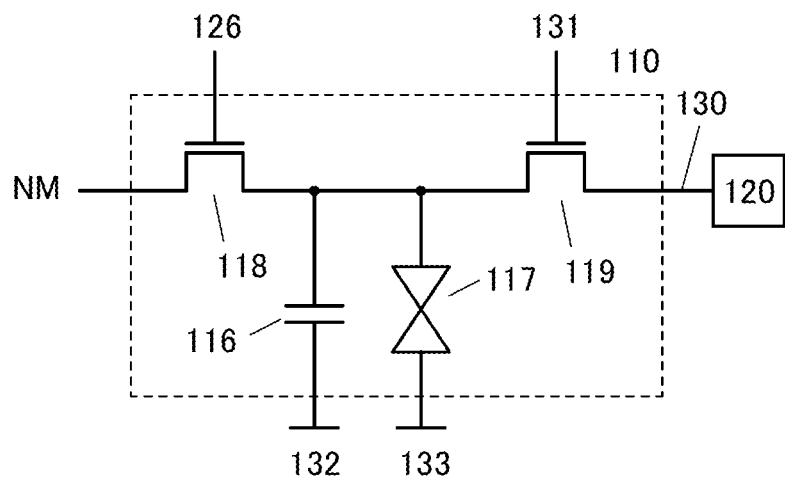

FIGS. 5(A) to 5(C) each illustrate an example of a structure including a liquid crystal element as the display element, which can be applied to the circuit block 110.

The structure illustrated in FIG. 5(A) includes a capacitor 116 and a liquid crystal element 117. One electrode of the liquid crystal element 117 is electrically connected to one electrode of the capacitor 116. The one electrode of the capacitor 116 is electrically connected to the node NM.

The other electrode of the capacitor 116 is electrically connected to a wiring 132. The other electrode of the liquid crystal element 117 is electrically connected to a wiring 133. The wirings 132 and 133 each have a function of supplying power. For example, the wirings 132 and 133 can each supply a reference potential such as GND or 0 V or a given potential.

In this structure, the operation of the liquid crystal element 117 starts when the potential of the node NM becomes equal to or higher than the operation threshold of the liquid crystal element 117. Thus, the display operation sometimes starts at time T1 in the timing charts illustrated in FIGS. 2(A1) and 2(B1), and it is preferable to use the structure for operation that requires no correction. Note that in the case of a transmissive liquid crystal display device, the combination of the operation of, for example, turning off a backlight until time T12 illustrated in FIGS. 2(A2) and 2(B2) with this structure can prevent unnecessary display operation from being visually identified.

FIG. 5(B) is a structure in which a transistor 118 is added to the structure in FIG. 5(A). One of a source and a drain of the transistor 118 is electrically connected to the one electrode of the capacitor 116. The other of the source and the drain of the transistor 118 is electrically connected to the node NM. A gate of the transistor 118 is electrically connected to the wiring 126. The wiring 126 can have a function of a signal line that controls the conduction of the transistor 118.

In this structure, the potential of the node NM is applied to the liquid crystal element 117 in response to the conduction of the transistor 118 Therefore, the operation of the liquid crystal element can start at or after time T12 in the timing charts illustrated in FIGS. 2(A2) and 2(B2), which is suitable for the operation that requires correction.

Note that while the transistor 118 is in a non-conducting state, potentials supplied to the capacitor 116 and the liquid crystal element 117 are retained continuously. Therefore, the potentials supplied to the capacitor 116 and the liquid crystal element 117 are preferably reset before image data rewriting. For the reset, a reset potential may be supplied to the wiring 124 to bring the transistor 102 and the transistor 118 into conduction at the same time, for example.

FIG. 5(C) is a structure in which a transistor 119 is added to the structure in FIG. 5(B). One of a source and a drain of the transistor 119 is electrically connected to the one electrode of the liquid crystal element 117 The other of the source and the drain of the transistor 119 is electrically connected to the wiring 130. A gate of the transistor 119 is electrically connected to the wiring 131. The wiring 131 can have a function of a signal line that controls the conduction of the transistor 119. Note that the gate of the transistor 119 may be electrically connected to the wiring 122.

The circuit 120 electrically connected to the wiring 130 is similar to that described in FIG. 4(C), and may have a function of resetting the potentials supplied to the capacitor 116 and the liquid crystal element 117.

Figure 6A:
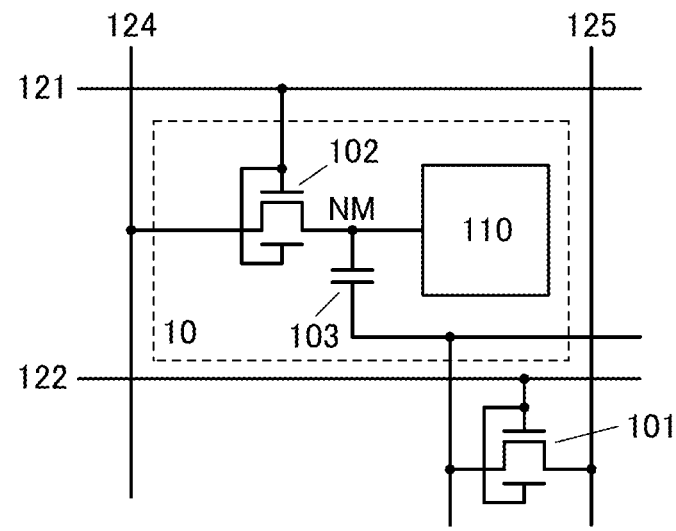
FIGS. 6A and 6B Diagrams illustrating pixel circuits.
Figure 6B:
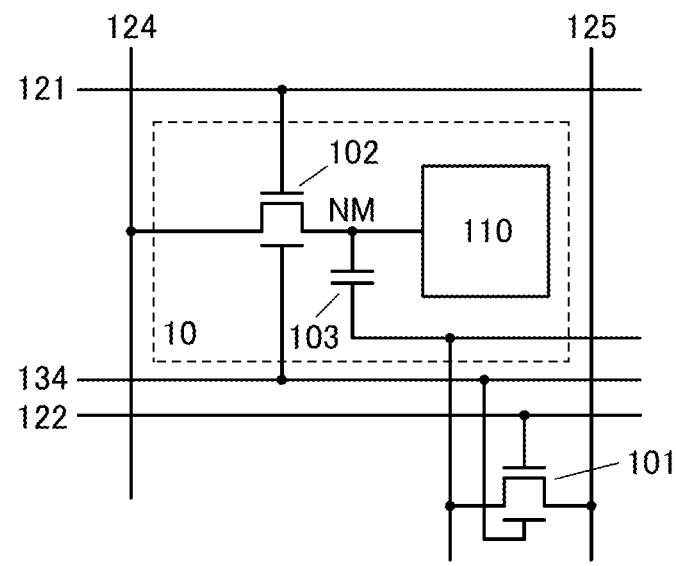

In addition, as illustrated in FIGS. 6(A) and 6(B), a structure in which the transistors 101 and 102 each include a back gate may be employed. FIG. 6(A) illustrates a structure in which the back gates are electrically connected to front gates, which has an effect of increasing on-state current. FIG. 6(B) illustrates a structure in which the back gates are electrically connected to a wiring 134 capable of supplying a constant potential, so that the threshold voltage of the transistors can be controlled. Note that back gates may also be provided for the transistors included in the circuit block 110 illustrated in FIGS. 4(A) to 4(C) and FIGS. 5(A) to 5(C).

Figure 7:
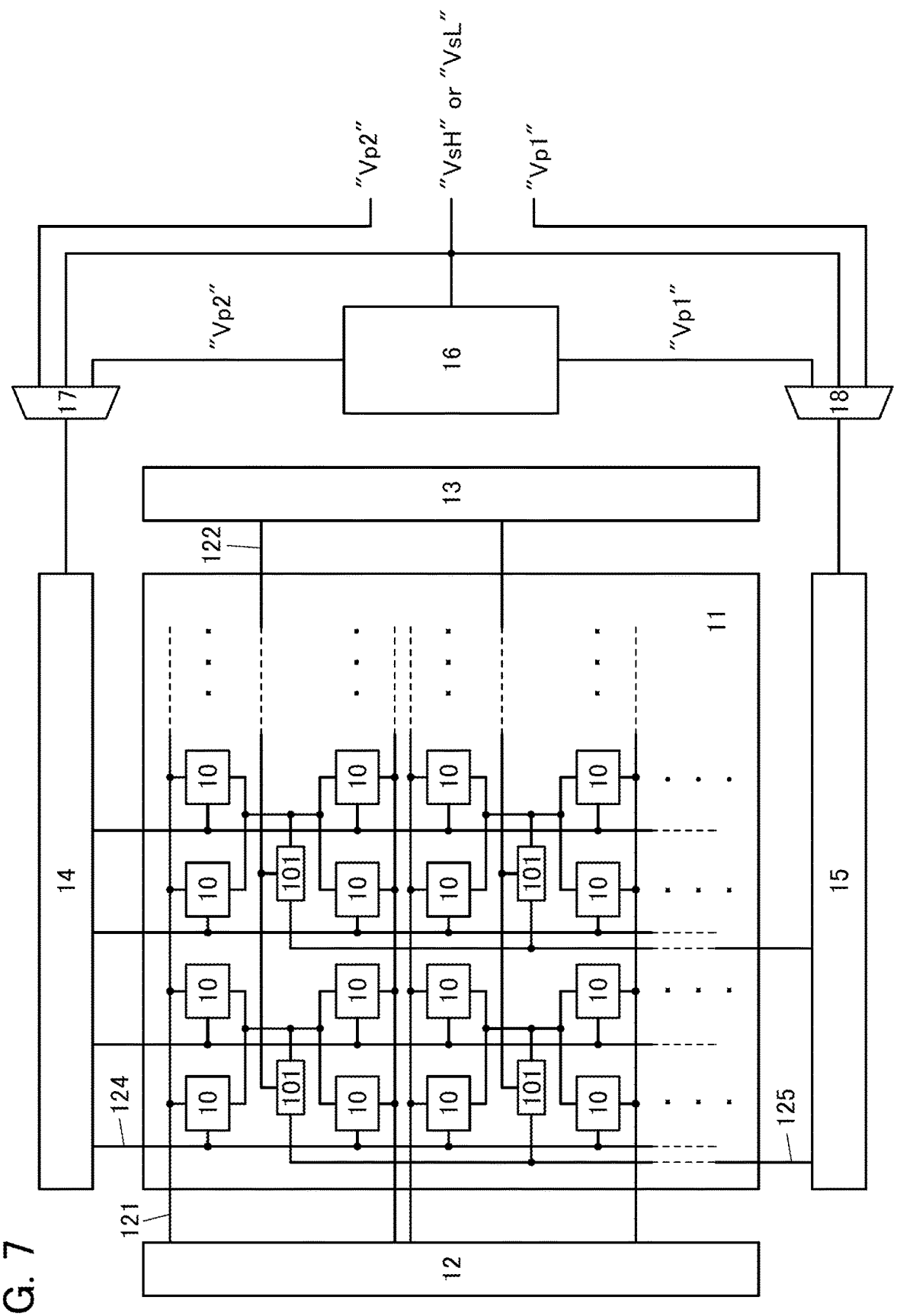
FIG. 7 A block diagram illustrating a display device.

FIG. 7 is an example of a block diagram of a display device in one embodiment of the present invention. The display device includes a pixel array 11 where the pixels 10 are arranged in a matrix, row drivers 12 and 13, column drivers 14 and 15, a circuit 16, and selection circuits 17 and 18.

For the row drivers 12 and 13 and the column drivers 14 and 15, shift register circuits, decoder circuits, and the like can be used, for example. The circuit 16 has a function of generating correction data. Note that the circuit 16 can also be referred to as an external device for generating correction data.

The row driver 12 is electrically connected to the wiring 121 and can control the conduction of the transistor 102. The row driver 13 is electrically connected to the wiring 122 and can control the conduction of the transistor 101. In addition, the column driver 14 is electrically connected to the wiring 124, and the column driver 15 is electrically connected to the wiring 125.

The image data "VsH" for a high resolution (e.g., 8K4K data) or the image data "VsL" for a low resolution (e.g., 4K2K data) is input to the circuit 16. When the image data "VsH" is input, the correction data "Vp1" is generated and output to the column driver 15 through the selection circuit 18. When the image data "VsL" is input, the correction data "Vp2" is generated and output to the column driver 14 through the selection circuit 17.

Note that the image data "VsH" can be input to the column driver 14 through the selection circuit 17. The image data "VsL" can be input to the column driver 15 through the selection circuit 18. In addition, in the case where the correction data Vp1 and the correction data Vp2 are input from the outside, the correction data Vp1 and the correction data Vp2 can be input to the column driver 14 or the column driver 15 through the selection circuit 17 or the selection circuit 18.

The circuit 16 may include a neural network. With the use of a deep neural network that has learned an enormous number of images as teacher data, for example, correction data with high accuracy can be generated.

Figure 8A:
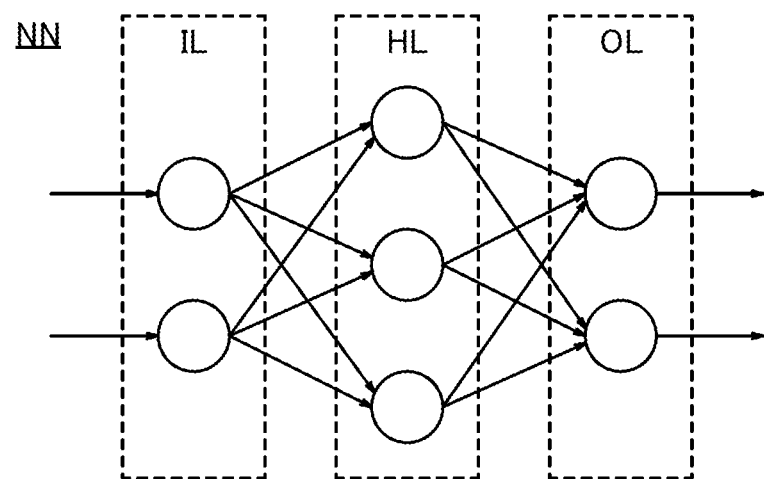
FIGS. 8A and 8B Diagrams illustrating a structure example of a neural network.

As illustrated in FIG. 8(A), a neural network NN can be formed of an input layer IL, an output layer OL, and a middle layer (hidden layer) HL. The input layer IL, the output layer OL, and the middle layer HL each include one or more neurons (units). Note that the middle layer HL may be one layer or two or more layers. A neural network including two or more middle layers HL can also be referred to as DNN (deep neural network), and learning using a deep neural network can also be referred to as deep learning.

Input data are input to neurons in the input layer IL. Output signals of neurons in the previous layer or the subsequent layer are input to neurons in the middle layer HL. Output signals of neurons in the previous layer are input to neurons in the output layer OL. Note that each neuron may be connected to all the neurons in the previous and subsequent layers (full connection), or may be connected to some of the neurons.

Figure 8B:
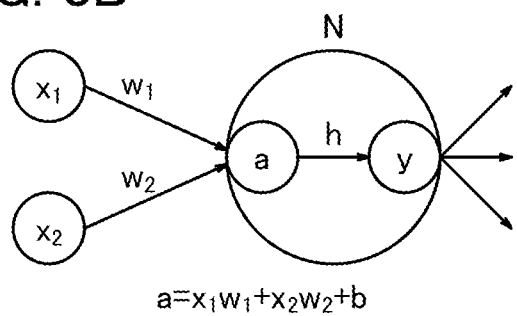

FIG. 8(B) illustrates an example of operation with neurons. Here, a neuron N and two neurons in the previous layer that output signals to the neuron N are shown. An output $x_1$ of the neuron in the previous layer and an output $x_2$ of the neuron in the previous layer are input to the neuron N. After that, in the neuron N, a total sum $x_1w_1+x_2w_2$ of the product of the output $x_1$ and a weight $w_1$ ($x_1w_1$) and the product of the output $x_2$ and a weight $w_2$ ($x_2w_2$) is calculated, and then a bias b is added as necessary, so that a value $a=x_1w_1+x_2w_2+b$ is obtained. Then, the value a is converted with an activation function h, and an output signal $y=h(a)$ is output from the neuron N.

In this manner, the operation with neurons includes operation that sums the products of outputs and weights of neurons in the previous layer, that is, product-sum operation ($x_1w_1+x_2w_2$ described above). This product-sum operation may be performed on software using a program or may be performed in hardware. In the case where the product-sum operation is performed in hardware, a product-sum operation circuit can be used. A digital circuit may be used or an analog circuit may be used as this product-sum operation circuit.

The product-sum operation circuit may be formed using a Si transistor or may be formed using an OS transistor. An OS transistor is particularly suitable for a transistor included in analog memory of the product-sum operation circuit because of its extremely low off-state current. Note that the product-sum operation circuit may be formed using both a Si transistor and an OS transistor.

Figure 9:
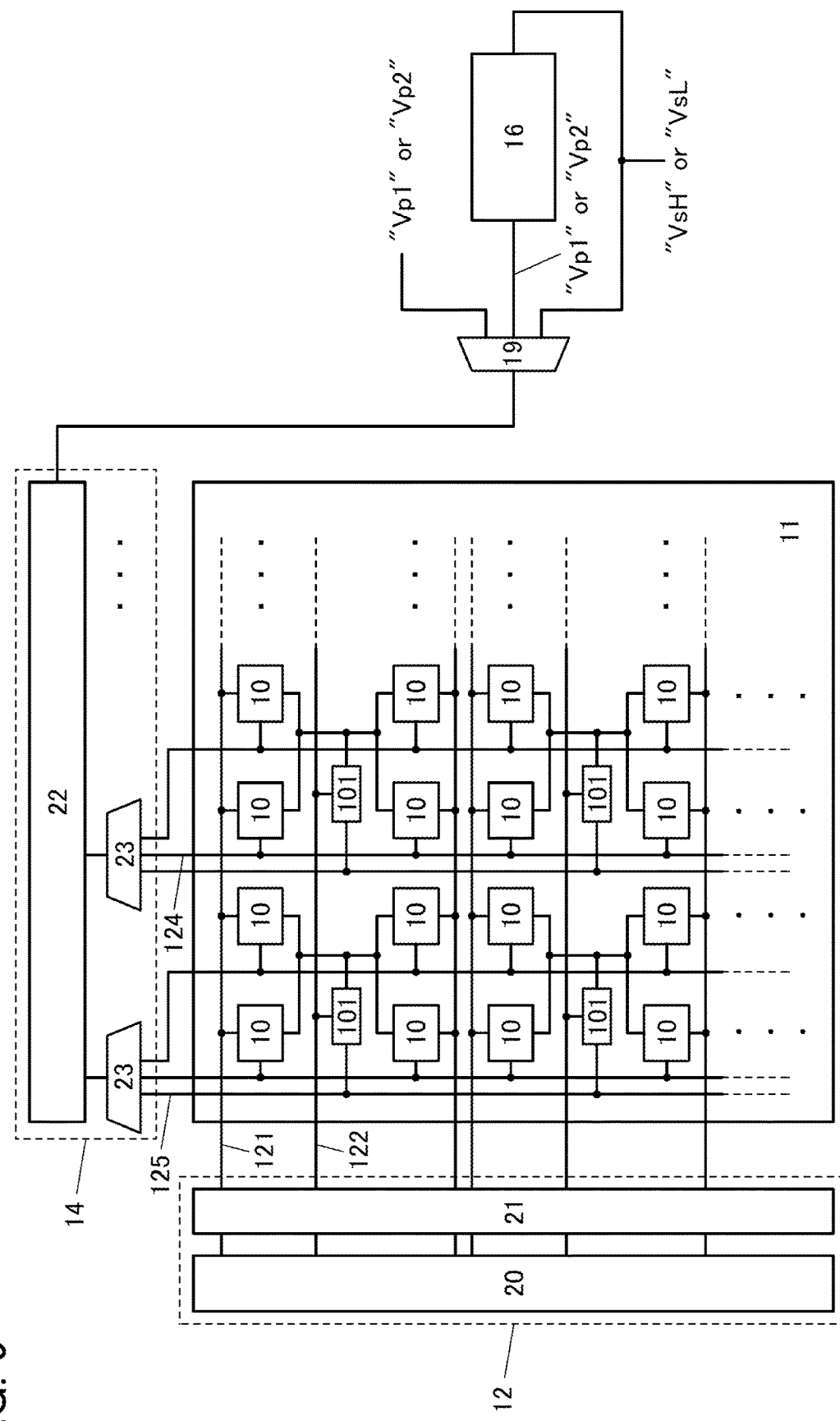
FIG. 9 A block diagram illustrating a display device.

In addition, as illustrated in FIG. 9, the function of the row driver 13 may be integrated into the row driver 12. Furthermore, the function of the column driver 15 may be integrated into the column driver 14. At this time, correction data, image data, and output data of the circuit 16 are input to a selection circuit 19, and any of the data is output to the column driver 14 at appropriate timing.

The row driver 12 can have a structure in which a shift register 20 and a buffer circuit 21 are combined, for example. When the conduction of the buffer circuit 21 is controlled, data can be selectively output to the wiring 121 or the wiring 122. In addition, the column driver 14 can have a structure in which a shift register 22 and a selection circuit 23 are combined, for example. The selection circuit 23 enables selective data output to the wiring 124 or the wiring 125.

In the structure illustrated in FIG. 7, drivers to be used vary depending on the resolution of image data. Thus, for example, in the case where low-resolution display operation without correction is performed, the row driver 13 and the column driver 15 can operate, and the row driver 12 and the column driver 14 can stop their operations. In addition, the number of wirings 122 and the number of wirings 125 that are to be used are half the number of wirings 121 and the number of wirings 124 that are not to be used, respectively, and power consumed in data charging and discharging can also be reduced. Furthermore, in the structure illustrated in FIG. 8, in the case where similar display operation is performed, power can be reduced when the number of output stages in the drivers is cut in half.

Figure 10:
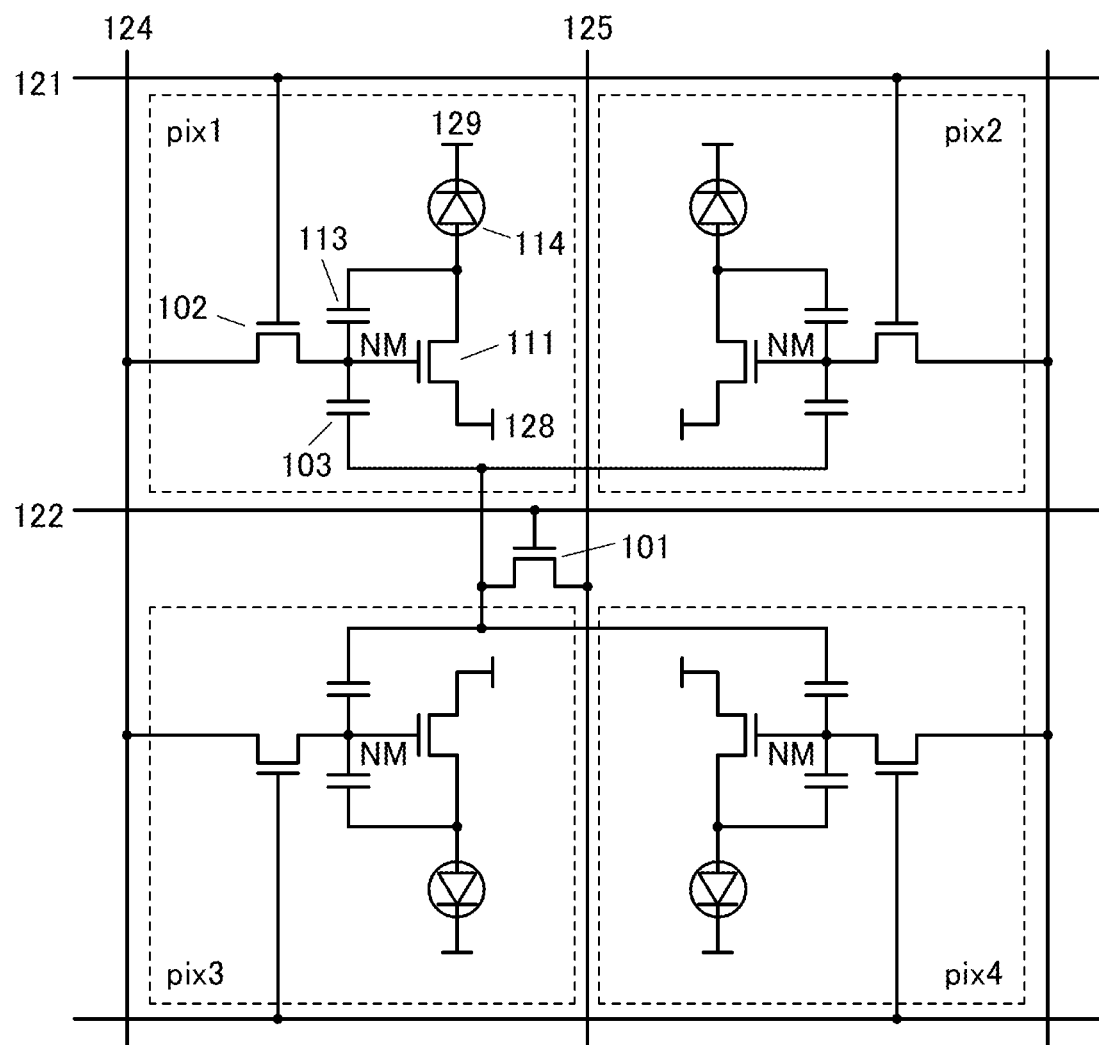
FIG. 10 A diagram illustrating a pixel configuration used for simulation.

Next, simulation results of a structure in which the circuit block illustrated in FIG. 4(A) is applied to the pixel array illustrated in FIG. 1 (see FIG. 10) are described. Parameters are as follows: the size of the transistor (the transistor 102) is L/W=6 μm/6 μm; the size of the other transistors is L/W=4 μm/4 μm; the capacitance of the capacitor 103 is 150 fF; the capacitance of the capacitor 113 is 50 fF; the EL element 114 is an FN diode model; the wiring 128 is set to an anode potential of +10 V; and the wiring 129 is set to a cathode potential of −5 V. Note that SPICE is used as circuit simulation software.

Figure 11A:
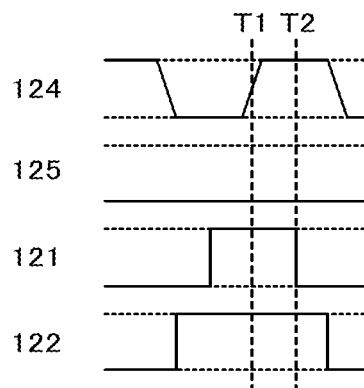
FIGS. 11A to 11C Diagrams showing simulation results.
Figure 11B:
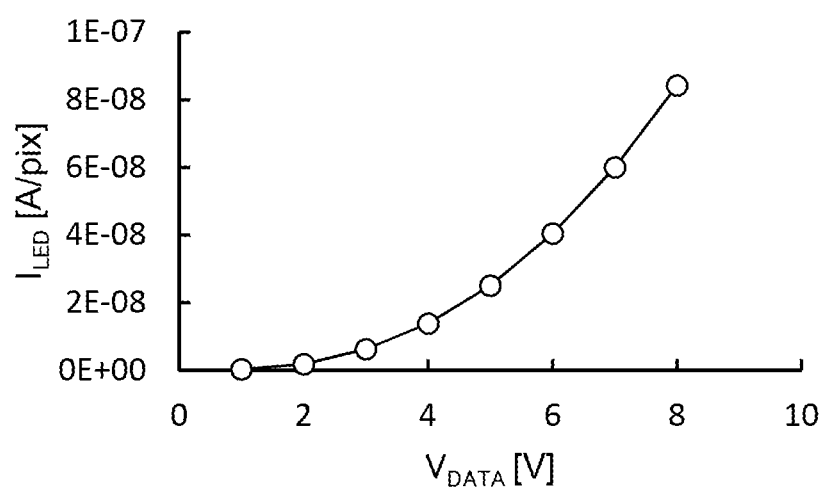
Figure 11C:
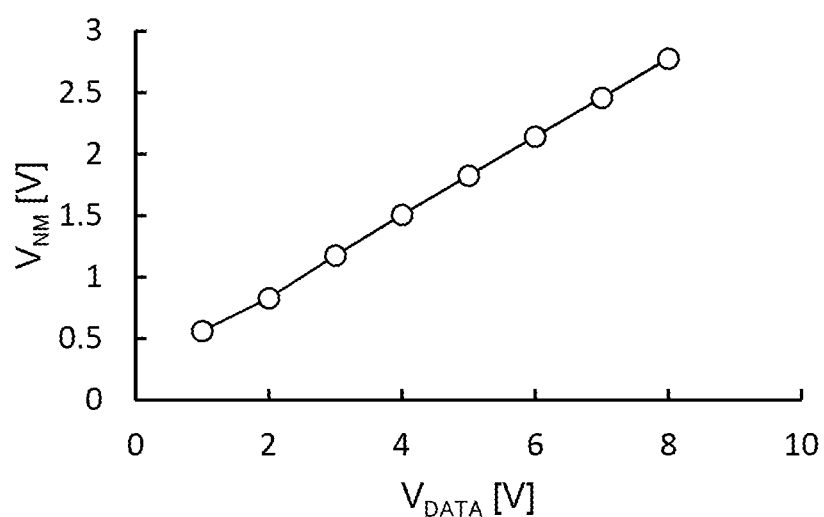

FIGS. 11(A) to 11(C) are simulation results of verification for high-resolution display (without correction). FIG. 11(A) is a timing chart used for the verification. The transistor 102 is brought into conduction from time T1 to T2 in FIG. 11(A), so that image data ($V_{DATA}$) is written from the wiring 124.

FIG. 11(B) is a simulation result of current ($I_{LED}$) that flows through the EL element 114 versus the image data ($V_{DATA}$). Although the simulation result for one pixel is shown in FIG. 11(B), the result indicates that grayscale display can be performed in all of the pixels (pix1 to pix4).

In addition, FIG. 11(C) is a simulation result of a change in the potential ($V_{NM}$) of the node NM versus the image data ($V_{DATA}$). The result indicates that the potential ($V_{NM}$) of the node NM is proportional to the image data "$V_{DATA}$" for all of the pixels.

In other words, the results indicate that the image data ($V_{DATA}$) for a high resolution that is supplied from the wiring 124 can be displayed.

Figure 12A:
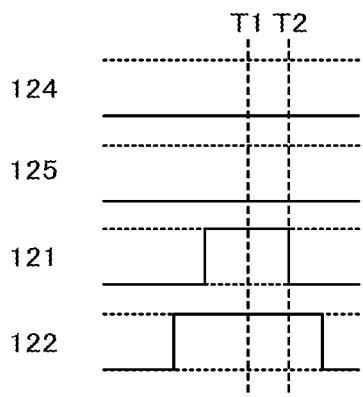
FIGS. 12A to 12D Diagrams showing simulation results.
Figure 12B:
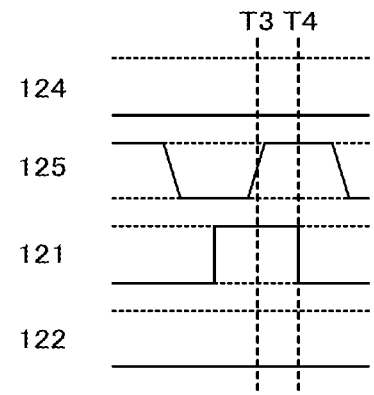
Figure 12C:
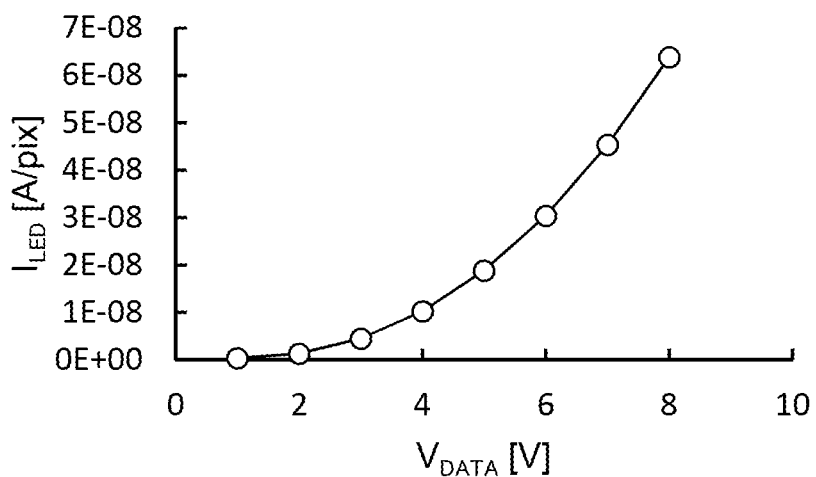

FIGS. 12(A) to 12(C) show simulation results of verification for low-resolution display (without correction). FIGS. 12(A) and 12(B) are timing charts used for the verification. First, the potential of the node NM is reset from time T1 to T2 in FIG. 12(A). After that, the transistor 101 is brought into conduction from time T3 to T4 shown in FIG. 12(B), so that the image data ($V_{DATA}$) is written from the wiring 125.

FIG. 12(C) is a simulation result of the current ($I_{LED}$) that flows through the EL element 114 versus the image data ($V_{DATA}$). Although the simulation result for one pixel is shown in FIG. 12(B), the result indicates that grayscale display can be performed in all of the pixels (pix1 to pix4).

Figure 12D:
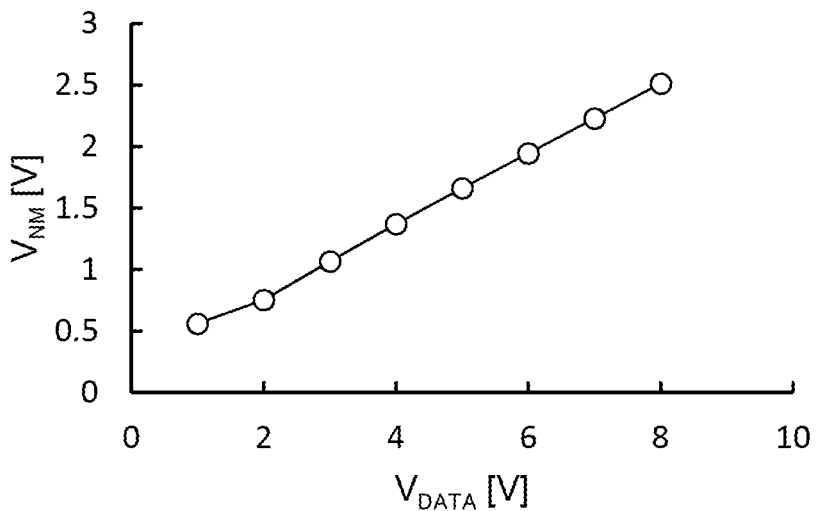

In addition, FIG. 12(D) is a simulation result of a change in the potential ($V_{NM}$) of the node NM versus the image data ($V_{DATA}$). The result indicates that the potential ($V_{NM}$) of the node NM is proportional to the image data ($V_{DATA}$) for all of the pixels.

In other words, the results indicate that the image data ($V_{DATA}$) for a low resolution that is supplied from the wiring 125 can be displayed.

Figure 13A:
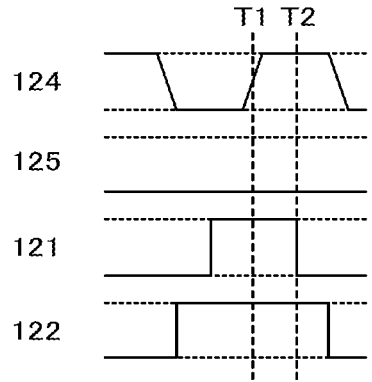
FIGS. 13A to 13D Diagrams showing simulation results.
Figure 13B:
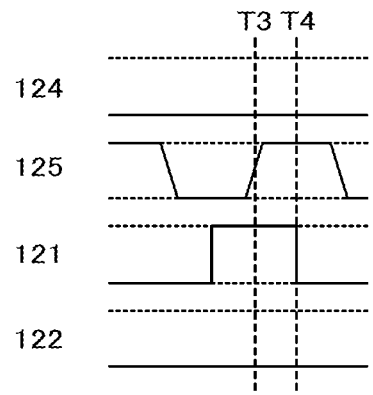
Figure 13C:
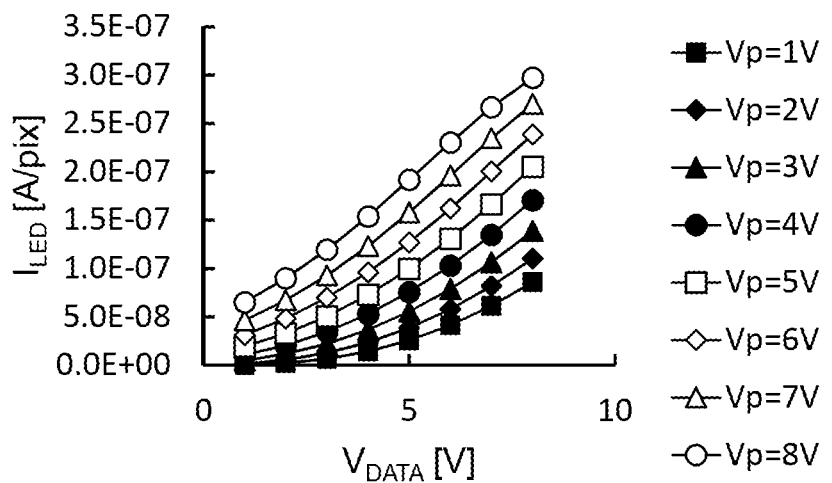

FIGS. 13(A) to 13(C) are simulation results of verification for low-resolution display (with correction). FIGS. 13(A) and 13(B) are timing charts used for the verification. First, correction data (Vp) is written from the wiring 124 to the node NM from time T1 to T2 in FIG. 13(A). After that, the transistor 101 is brought into conduction from time T3 to T4 shown in FIG. 13(B), so that the image data ($V_{DATA}$) is written from the wiring 125.

FIG. 13(C) is a simulation result of the current ($I_{LED}$) that flows through the EL element 114 versus the image data for each correction data. The result indicates that grayscale display can be performed in each of the cases where 1 V to 8 V are written as the correction data (Vp) and are combined with the image data ($V_{DATA}$).

Figure 13D:
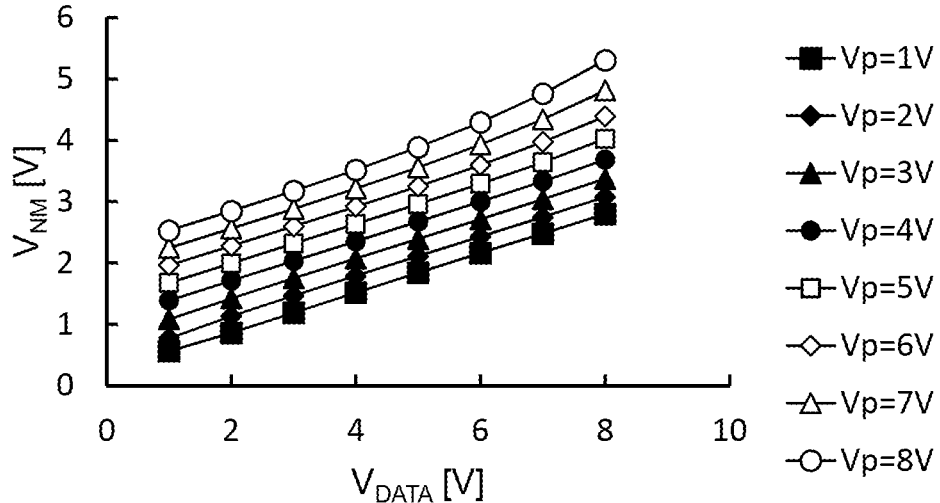

In addition, FIG. 13(D) is a simulation result of a change in the potential ($V_{NM}$) of the node NM versus the image data ($V_{DATA}$) for each correction data (Vp). The result indicates that the potential ($V_{NM}$) of the node NM is proportional to the image data ($V_{DATA}$)+the correction data (Vp) in each of the cases where 1 V to 8 V are written as the correction data (Vp) and are combined with the image data ($V_{DATA}$).

In other words, display can be performed when the image data ($V_{DATA}$) for a low resolution that is supplied from the wiring 125 is combined with the correction data (Vp) that is supplied from the wiring 124.

Figure 14:
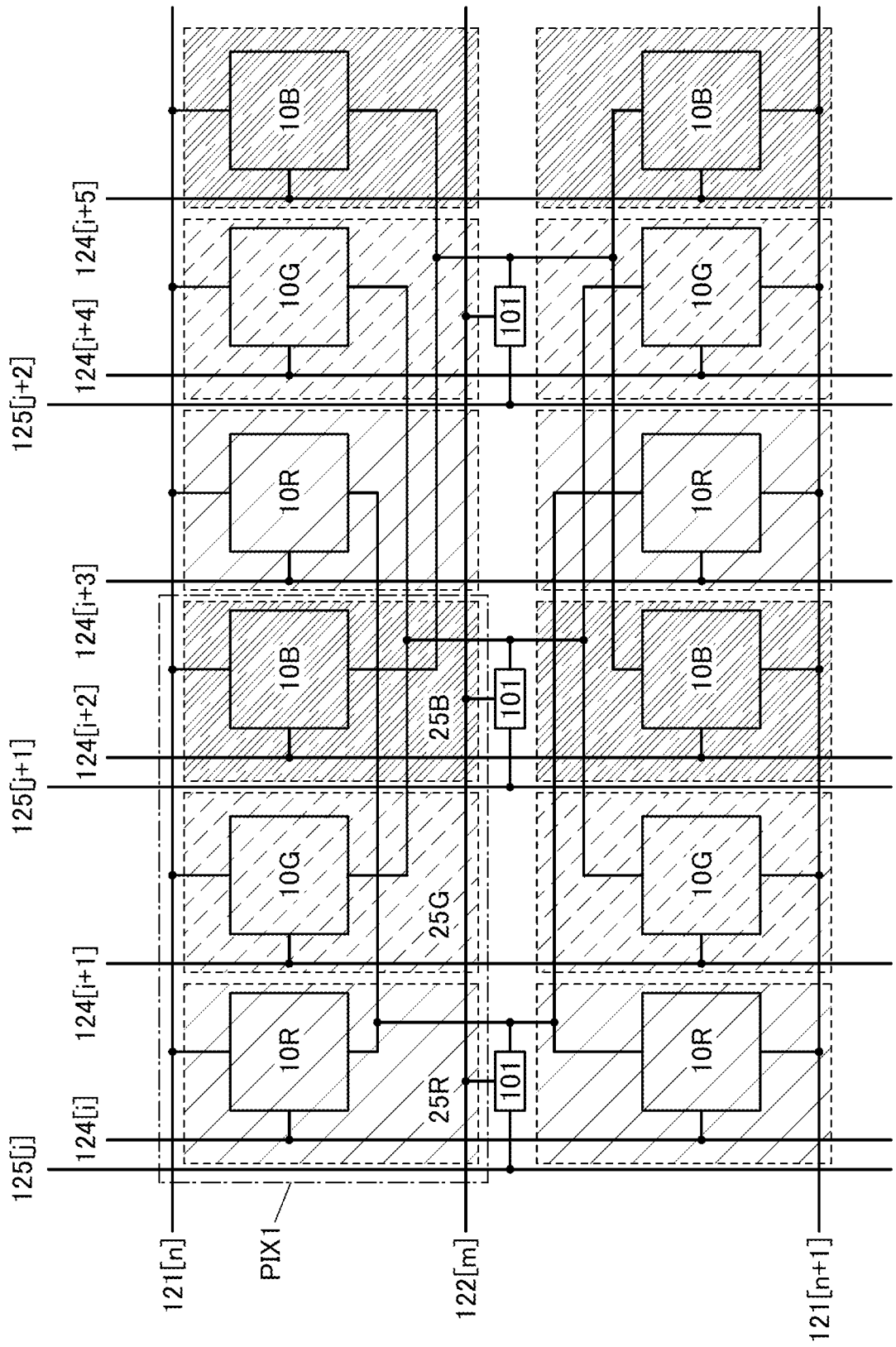
FIG. 14 A diagram illustrating a pixel configuration.

FIG. 14 is an example of the case where pixels of one embodiment of the present invention are employed in an EL display device capable of performing color display. In general, a pixel in a display device capable of performing color display includes a combination of subpixels that emit colors of R (red), G (green), and B (blue). In FIG. 14, three subpixels of a subpixel 10R, a subpixel 10G, and a subpixel 10B arranged in a horizontal direction form one pixel, and four pixels are illustrated in horizontal and vertical directions. Note that wirings such as power supply lines are omitted in FIG. 14.

As described above, in one embodiment of the present invention, the correction data Vp1 or the image data VsL can be input to four pixels arranged in a matrix with the transistor 101 therebetween (here, corresponding to four subpixels that emit the same color). Here, the wiring 124 electrically connected to the subpixels is provided for every column, and the wiring 125 electrically connected to the transistor 101 is provided for every two subpixels in the horizontal direction.

In the structure, for example, in a pixel (PIX1) in the upper left of FIG. 14, one wiring 124 [$i$+1] is provided between the subpixel 10R and the subpixel 10G, and two wirings of a wiring 124 [$i$+2] and a wiring 125 [$j$+1] are provided between the subpixel 10G and the subpixel 10B. Therefore, in the case where the layout of each component is made as dense as possible, it is difficult to make the distance between the subpixels (the distance between components having the same function) constant.

Thus, when pixel electrodes connected to the subpixel 10R, the subpixel 10G, and the subpixel 10B are denoted by electrodes 25R, 25G, and 25B, respectively, it is preferable to use a structure where the electrodes 25R, 25G, and 25B are arranged at regular intervals as illustrated in FIG. 14. Note that here for clarity, the pixel electrode is assumed as a different component though the pixel electrode can also be assumed as a component of each subpixel. This structure is effective for a top-emission EL display device or a reflective liquid crystal display device.

Figure 15:
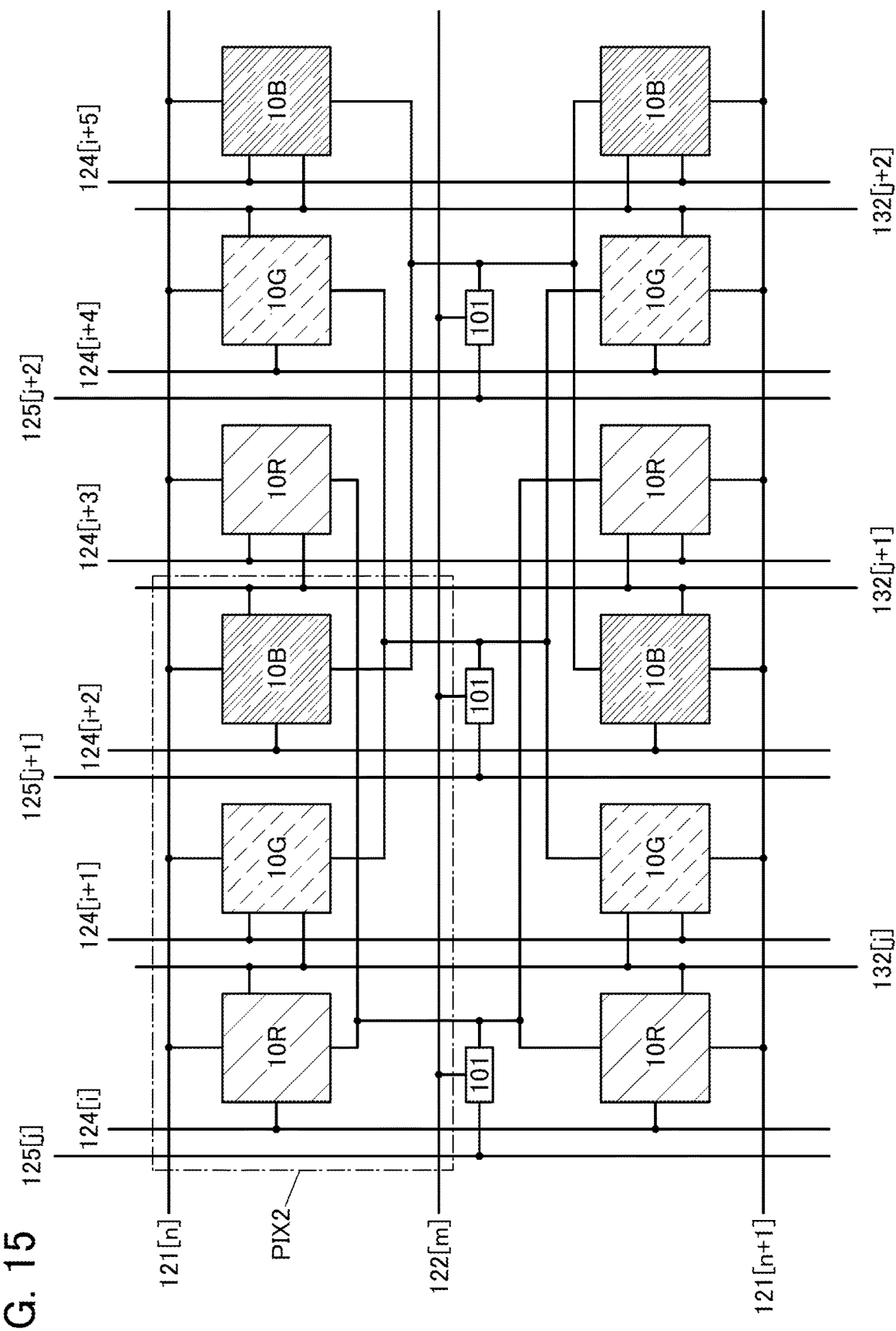
FIG. 15 A diagram illustrating a pixel configuration.

FIG. 15 is an example of the case where pixels of one embodiment of the present invention are employed in a liquid crystal display device capable of performing color display. To make the distance between subpixels in the liquid crystal display device constant, for example, in a pixel (PIX 2) in the upper left of FIG. 15, a wiring 132[$j$] to which the other electrode of the capacitor 116 is electrically connected may be provided between the subpixel 10R and the subpixel 10G. The capacitors 116 included in the subpixels 10R and the subpixels 10G are electrically connected to the wiring 132. Note that the capacitors 116 included in the subpixels 10B may be electrically connected to a wiring 132 [$j$+1] provided between the subpixels 10B and the subpixels 10R in adjacent pixels.

This embodiment can be implemented in an appropriate combination with the structures described in the other embodiments and the like.

Embodiment 2

In this embodiment, structure examples of a display element using a liquid crystal element and structure examples of a display device using an EL element are described. Note that the description of the components, operation, and functions of the display device described in Embodiment 1 is omitted in this embodiment.

Figure 16A:
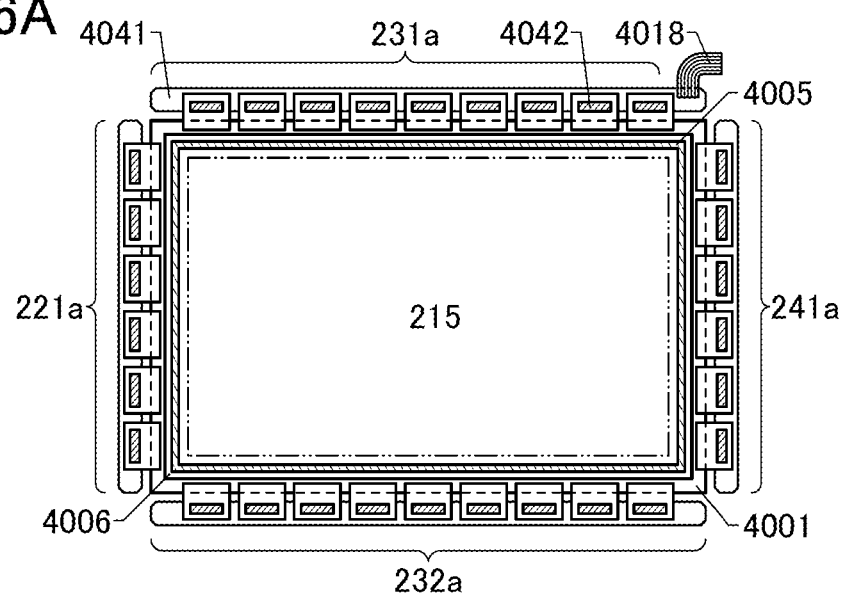
FIGS. 16A to 16C Diagrams illustrating display devices.
Figure 16B:
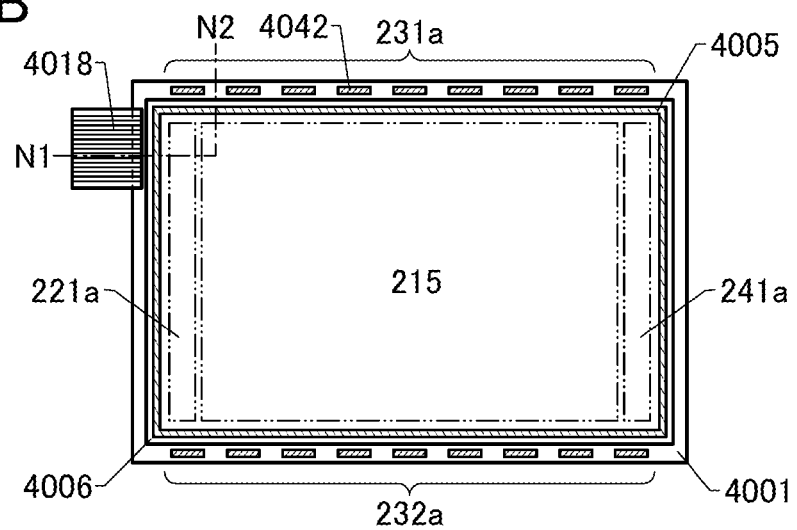
Figure 16C:
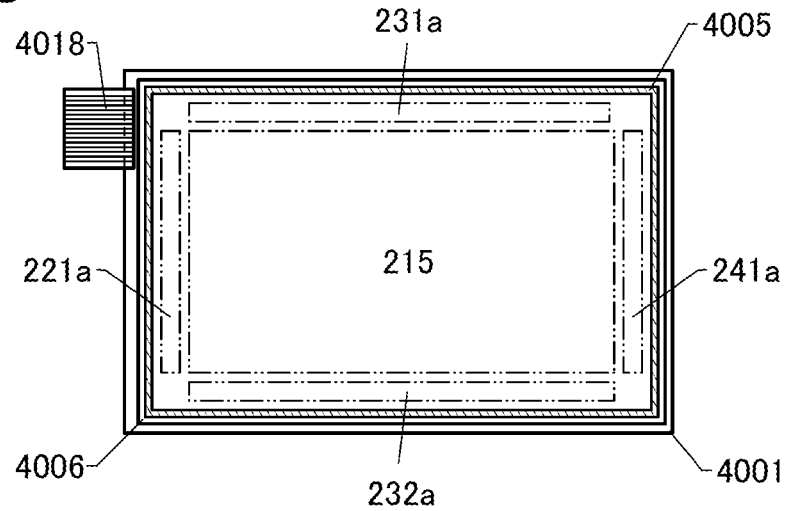

FIGS. 16(A) to 16(C) are diagrams each illustrating a structure of a display device in which one embodiment of the present invention can be used.

In FIG. 16(A), a sealant 4005 is provided to surround a display portion 215 provided over a first substrate 4001, and the display portion 215 is sealed with the first substrate 4001, the sealant 4005, and a second substrate 4006.

The pixel array 11 illustrated in FIG. 7 or FIG. 9 in Embodiment 1 is provided in the display portion 215. Note that in the following description, a scan line driver circuit corresponds to a row driver, and a signal line driver circuit corresponds to a column driver.

In FIG. 16(A), a scan line driver circuit 221a, a signal line driver circuit 231a, a signal line driver circuit 232a, and a common line driver circuit 241a each include a plurality of integrated circuits 4042 provided over a printed board 4041. The integrated circuits 4042 are formed using a single crystal semiconductor or a polycrystalline semiconductor. The signal line driver circuit 231a and the signal line driver circuit 232a each have a function of the column driver described in Embodiment 1. The scan line driver circuit 221a has a function of the row driver described in Embodiment 1. The common line driver circuit 241a has a function of supplying a predetermined potential to a wiring for supplying power and a wiring for supplying Vref described in Embodiment 1.

Various signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted on regions different from a region surrounded by the sealant 4005 over the first substrate 4001.

Note that there is no particular limitation on the connection method of the integrated circuits 4042; a wire bonding method, a COG (Chip On Glass) method, a TCP (Tape Carrier Package) method, a COF (Chip On Film) method, or the like can be used.

FIG. 16(B) illustrates an example of mounting the integrated circuits 4042 included in the signal line driver circuit 231a and the signal line driver circuit 232a by a COG method. Some or all of the driver circuits can be formed over the same first substrate 4001 as the display portion 215, so that a system-on-panel can be formed.

In the example illustrated in FIG. 16(B), the scan line driver circuit 221a and the common line driver circuit 241a are formed over the same substrate as the display portion 215. When the driver circuits are formed at the same time as a pixel circuit in the display portion 215, the number of components can be reduced. Accordingly, productivity can be increased.

In addition, in FIG. 16(B), the sealant 4005 is provided to surround the display portion 215, the scan line driver circuit 221a, and the common line driver circuit 241a that are provided over the first substrate 4001. Furthermore, the second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element by the first substrate 4001, the sealant 4005, and the second substrate 4006.

In addition, although the signal line driver circuit 231a and the signal line driver circuit 232a are formed separately and mounted on the first substrate 4001 in the example illustrated in FIG. 16(B), one embodiment of the present invention is not limited to this structure. A scan line driver circuit may be formed separately and mounted, or part of a signal line driver circuit or part of a scan line driver circuit may be formed separately and mounted. Alternatively, the signal line driver circuit 231a and the signal line driver circuit 232a may be formed over the same substrate as the display portion 215, as illustrated in FIG. 16(C).

In addition, the display device sometimes encompasses a panel in which a display element is sealed, and a module in which an IC or the like including a controller is mounted on the panel.

Furthermore, the display portion and the scan line driver circuit provided over the first substrate each include a plurality of transistors. As the transistors, the transistors described in the above embodiment can be employed.

A transistor included in a peripheral driver circuit and a transistor included in the pixel circuit of the display portion may have the same structure or different structures. All the transistors included in the peripheral driver circuit may have the same structure or may use the combination of two or more kinds of structures. Similarly, all the transistors included in the pixel circuit may have the same structure or may use the combination of two or more kinds of structures.

In addition, an input device 4200 can be provided over the second substrate 4006. The structure where the display device illustrated in FIG. 16 is provided with the input device 4200 can function as a touch panel.

There is no limitation on a sensor element included in a touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive type include a surface capacitive type and a projected capacitive type. In addition, examples of the projected capacitive type include a self-capacitive type and a mutual capacitive type. The use of a mutual capacitive type is preferred because multiple points can be sensed simultaneously.

The touch panel of one embodiment of the present invention can employ a variety of structures such as a structure in which a display device and a sensor element that are separately manufactured are attached to each other and a structure in which electrodes and the like included in a sensor element are provided on one or both of a substrate supporting a display element and a counter substrate.

Figure 17A:
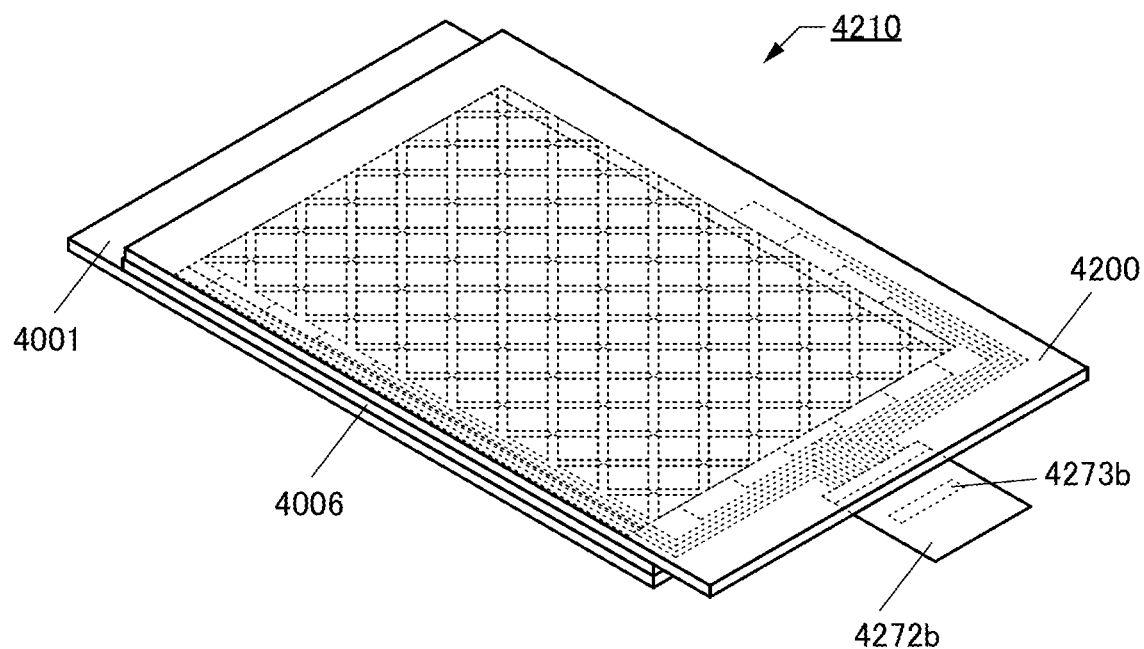
FIGS. 17A and 17B Diagrams illustrating a touch panel.
Figure 17B:
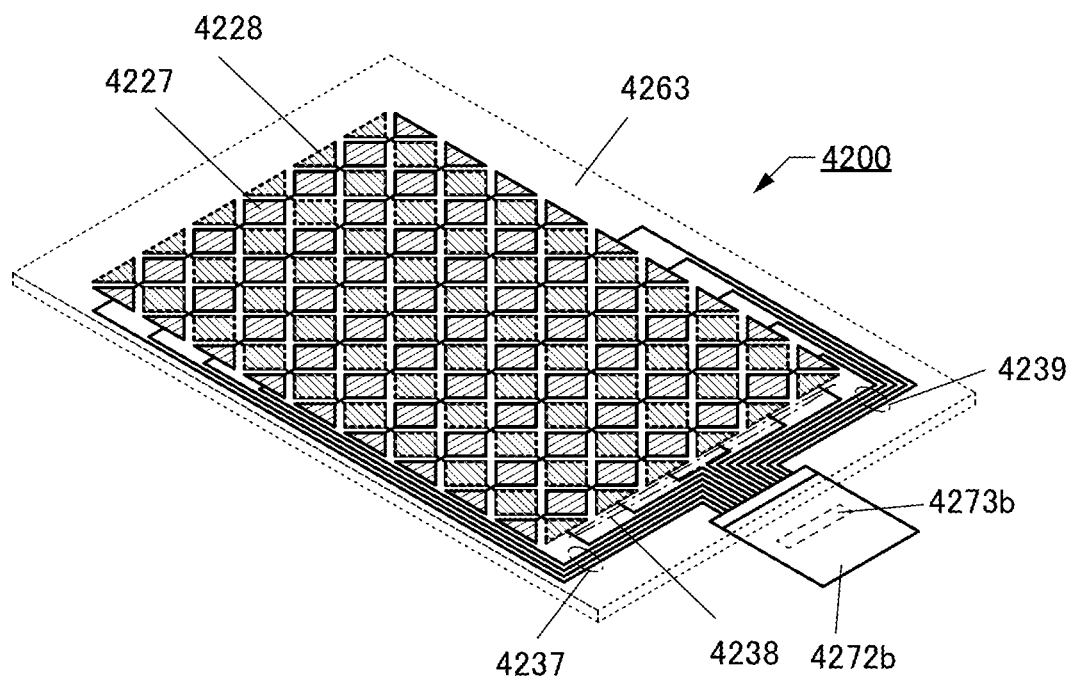

FIGS. 17(A) and 17(B) illustrate an example of a touch panel. FIG. 17(A) is a perspective view of a touch panel 4210. FIG. 17(B) is a schematic perspective view of the input device 4200. Note that for clarity, only typical components are illustrated.

The touch panel 4210 has a structure in which a display device and a sensor element that are separately manufactured are attached to each other.

The touch panel 4210 includes the input device 4200 and a display device that are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

Alternatively, a touch sensor may be provided between the first substrate 4001 and the second substrate 4006 in the display device. When a touch sensor is provided between the first substrate 4001 and the second substrate 4006, an optical touch sensor using a photoelectric conversion element as well as a capacitive touch sensor may be employed.

FIG. 18(A) and FIG. 18(B) are cross-sectional views of a portion indicated by chain line N1-N2 in FIG. 16(B). Display devices illustrated in FIG. 18(A) and FIG. 18(B) each include an electrode 4015, and the electrode 4015 is electrically connected to a terminal included in the FPC 4018 through an anisotropic conductive layer 4019. Furthermore, in FIG. 18(A) and FIG. 18(B), the electrode 4015 is electrically connected to a wiring 4014 in an opening formed in an insulating layer 4112, an insulating layer 4111, and an insulating layer 4110.

The electrode 4015 is formed using the same conductive layer as a first electrode layer 4030, and the wiring 4014 is formed using the same conductive layer as source electrodes and drain electrodes of a transistor 4010 and a transistor 4011.

In addition, the display portion 215 and the scan line driver circuit 221a that are provided over the first substrate 4001 each include a plurality of transistors. In FIG. 18(A) and FIG. 18(B), the transistor 4010 included in the display portion 215 and the transistor 4011 included in the scan line driver circuit 221a are illustrated as examples. Note that in the examples illustrated in FIG. 18(A) and FIG. 18(B), the transistor 4010 and the transistor 4011 are bottom-gate transistors but may be top-gate transistors.

In FIG. 18(A) and FIG. 18(B), the insulating layer 4112 is provided over the transistor 4010 and the transistor 4011. In addition, a partition 4510 is formed over the insulating layer 4112 in FIG. 18(B).

Furthermore, the transistor 4010 and the transistor 4011 are provided over an insulating layer 4102. Moreover, the transistor 4010 and the transistor 4011 each include an electrode 4017 formed over the insulating layer 4111. The electrode 4017 can function as a back gate electrode.

The display devices illustrated in FIG. 18(A) and FIG. 18(B) each further include a capacitor 4020. The capacitor 4020 includes an electrode 4021 formed in the same step as a gate electrode of the transistor 4010, and an electrode formed in the same step as a source electrode and a drain electrode of the transistor 4010. The electrodes overlap with each other with an insulating layer 4103 therebetween.

In general, the capacitance of a capacitor provided in a pixel portion of a display device is set in consideration of leakage current or the like of a transistor provided in the pixel portion so that charge can be retained for a predetermined period. The capacitance of the capacitor may be set in consideration of off-state current or the like of the transistor.

The transistor 4010 provided in the display portion 215 is electrically connected to the display element. FIG. 18(A) is an example of a liquid crystal display device using a liquid crystal element as a display element. In FIG. 18(A), a liquid crystal element 4013 that is a display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 therebetween.

A spacer 4035 is a columnar spacer obtained by selective etching of an insulating layer and is provided to control the distance (cell gap) between the first electrode layer 4030 and the second electrode layer 4031. Note that a spherical spacer may be used.

In addition, a black matrix (light-blocking layer), a coloring layer (color filter), an optical member (optical substrate) such as a polarizing member, a retardation member, or an anti-reflection member, and the like may be provided as appropriate if needed. For example, circular polarization using a polarizing substrate and a retardation substrate may be employed. Furthermore, a backlight, a side light, or the like may be used as a light source. Moreover, a micro LED or the like may be used as the backlight or the side light.

In the display device illustrated in FIG. 18(A), a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. A stacked-layer film of films containing the material of the coloring layer can also be used for the light-blocking layer. For example, it is possible to employ a stacked-layer structure of a film containing a material used for a coloring layer that transmits light of a certain color and a film containing a material used for a coloring layer that transmits light of another color. Material sharing between the coloring layer and the light-blocking layer is preferable because process simplification as well as equipment sharing can be achieved.

Examples of a material that can be used for the coloring layer include a metal material, a resin material, and a resin material containing a pigment or dye. The light-blocking layer and the coloring layer may be formed by a method similar to the method for forming each layer. For example, the light-blocking layer and the coloring layer may be formed by an inkjet method or the like.

The display devices illustrated in FIG. 18(A) and FIG. 18(B) each further include the insulating layer 4111 and an insulating layer 4104. As the insulating layer 4111 and the insulating layer 4104, insulating layers through which impurity elements do not easily pass are used. A semiconductor layer of the transistor is sandwiched between the insulating layer 4111 and the insulating layer 4104, so that entry of impurities from the outside can be prevented.

In addition, a light-emitting element utilizing electroluminescence (EL element) can be used as the display element included in the display device. An EL element includes a layer containing a light-emitting compound (also referred to as an "EL layer") between a pair of electrodes. By generating a potential difference that is greater than the threshold voltage of the EL element between the pair of electrodes, holes are injected from an anode side to the EL layer and electrons are injected from a cathode side to the EL layer. The injected electrons and holes are recombined in the EL layer, and a light-emitting substance contained in the EL layer emits light.

Furthermore, EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are then recombined; thus, a light-emitting organic compound forms an excited state, and light is emitted when the excited state returns to a ground state. Owing to such a mechanism, such a light-emitting element is referred to as a current-excitation light-emitting element.

Note that in addition to the light-emitting compound, the EL layer may include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that the description is made here using an organic EL element as a light-emitting element.

In order to extract light emitted from the light-emitting element, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 18(B) is an example of a light-emitting display device using a light-emitting element as a display element (also referred to as an "EL display device"). A light-emitting element 4513 that is a display element is electrically connected to the transistor 4010 provided in the display portion 215. Note that the structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513.

The partition 4510 is formed using an organic insulating material or an inorganic insulating material. It is particularly preferable that a photosensitive resin material be used, and that an opening portion be formed over the first electrode layer 4030 such that a side surface of the opening portion is formed to be an inclined surface having continuous curvature.

The light-emitting layer 4511 may be formed using a single layer or may be formed such that a plurality of layers are stacked.

The emission color of the light-emitting element 4513 can be white, red, green, blue, cyan, magenta, yellow, or the like depending on the material included in the light-emitting layer 4511.

Examples of a method for achieving color display include a method in which the light-emitting element 4513 whose emission color is white is combined with a coloring layer and a method in which the light-emitting element 4513 with a different emission color is provided in each pixel. The former method is more productive than the latter method. On the other hand, the latter method, which requires separate formation of the light-emitting layer 4511 pixel by pixel, is less productive than the former method. However, the latter method enables higher color purity of the emission color than the former method. When the light-emitting element 4513 has a microcavity structure in addition to the latter method, the color purity can be further increased.

Note that the light-emitting layer 4511 may contain an inorganic compound such as quantum dots. For example, when quantum dots are used for the light-emitting layer, the quantum dots can function as a light-emitting material.

A protective layer may be formed over the second electrode layer 4031 and the partition 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In addition, in a space that is sealed by the first substrate 4001, the second substrate 4006, and the sealant 4005, a filler 4514 is provided and hermetically sealed. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic-based resin, polyimide, an epoxy-based resin, a silicone-based resin, PVB (polyvinyl butyral), EVA (ethylene vinyl acetate), or the like can be used. In addition, a drying agent may be contained in the filler 4514.

For the sealant 4005, a glass material such as a glass frit or a resin material such as a resin that is curable at room temperature (e.g., a two-component-mixture-type resin), a light curable resin, or a thermosetting resin can be used. In addition, a drying agent may be contained in the sealant 4005.

In addition, if needed, an optical film such as a polarizing plate, a circularly polarizing plate (including an elliptically polarizing plate), a retardation plate (a λ/4 plate or a λ/2 plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

In addition, when the light-emitting element has a microcavity structure, light with high color purity can be extracted. Furthermore, when a microcavity structure and a color filter are used in combination, glare can be reduced and the visibility of a displayed image can be increased.

Whether the first electrode layer and the second electrode layer (also referred to as a pixel electrode layer, a common electrode layer, a counter electrode layer, or the like) for applying voltage to the display element have light-transmitting properties or light-reflecting properties may be determined in accordance with the direction in which light is extracted, the position where the electrode layer is provided, and the pattern structure of the electrode layer.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

In addition, the first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and metal nitrides thereof.

In addition, the first electrode layer 4030 and the second electrode layer 4031 can be formed using a conductive composition including a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Furthermore, since the transistors are easily broken by static electricity or the like, a protective circuit for protecting the driver circuit is preferably provided. The protective circuit is preferably formed using a nonlinear element.

This embodiment can be implemented in an appropriate combination with the structures described in the other embodiments and the like.

Embodiment 3

In this embodiment, examples of a transistor that can be replaced with each transistor described in the above embodiments are described with reference to drawings.

The display device of one embodiment of the present invention can be manufactured using a transistor with various modes, such as a bottom-gate transistor or a top-gate transistor. Therefore, a material used for a semiconductor layer or a transistor structure can be easily changed depending on the existing manufacturing line.

[Bottom-Gate Transistor]

FIG. 19(A1) is a cross-sectional view in the channel length direction of a channel protective transistor 810 that is a kind of bottom-gate transistor. In FIG. 19(A1), the transistor 810 is formed over a substrate 771. In addition, the transistor 810 includes an electrode 746 over the substrate 771 with an insulating layer 772 therebetween. The transistor 810 further includes a semiconductor layer 742 over the electrode 746 with an insulating layer 726 therebetween. The electrode 746 can function as a gate electrode. The insulating layer 726 can function as a gate insulating layer.

The transistor 810 further includes an insulating layer 741 over a channel formation region in the semiconductor layer 742. The transistor 810 further includes an electrode 744a and an electrode 744b that are partly in contact with the semiconductor layer 742 and are over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be achieved.

Furthermore, the transistor 810 includes an insulating layer 728 over the electrode 744a, the electrode 744b, and the insulating layer 741 and includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. The carrier concentration in regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as a source region or a drain region of the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 19(A2) is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is sandwiched between a gate electrode and the back gate electrode. Thus, the back gate electrode can function in a manner similar to that of the gate electrode. The potential of the back gate electrode may be set equal to the potential of the gate electrode, or may be a ground potential (GND potential) or a given potential. Moreover, by changing the potential of the back gate electrode not in synchronization with but independently of that of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode," the other is referred to as a "back gate electrode." For example, in the case where the electrode 723 in the transistor 811 is referred to as a "gate electrode," the electrode 746 is referred to as a "back gate electrode." In addition, in the case where the electrode 723 is used as a "gate electrode," the transistor 811 can be considered as a kind of top-gate transistor. Furthermore, in some cases, one of the electrode 746 and the electrode 723 is referred to as a "first gate electrode," and the other is referred to as a "second gate electrode."

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be achieved.

In addition, the gate electrode and the back gate electrode are formed using conductive layers and thus each have a function of preventing an electric field generated outside the transistor from influencing a semiconductor layer in which a channel is formed (in particular, an electric field blocking function against static electricity or the like). Note that when the back gate electrode is formed larger than the semiconductor layer such that the semiconductor layer is covered with the back gate electrode, the electric field blocking function can be enhanced.

Furthermore, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with high reliability can be achieved. Moreover, a semiconductor device with high reliability can be achieved.

FIG. 19(B1) is a cross-sectional view in the channel length direction of a channel-protective transistor 820, which has a structure different from the structure in FIG. 19(A1). The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744a in an opening portion formed by selectively removing part of the insulating layer 741 that overlaps with the semiconductor layer 742. Furthermore, the semiconductor layer 742 is electrically connected to the electrode 744b in another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 19(B2) is different from the transistor 820 in that the electrode 723 that can function as a back gate electrode is provided over the insulating layer 729.

By providing the insulating layer 741, the semiconductor layer 742 can be prevented from being exposed at the time of forming the electrode 744a and the electrode 744b. Thus, the semiconductor layer 742 can be prevented from being thinned down at the time of forming the electrode 744a and the electrode 744b.

In addition, the distance between the electrode 744a and the electrode 746 and the distance between the electrode 744b and the electrode 746 in the transistor 820 and the transistor 821 are larger than those in the transistor 810 and the transistor 811. Thus, parasitic capacitance generated between the electrode 744a and the electrode 746 can be reduced. Moreover, parasitic capacitance generated between the electrode 744b and the electrode 746 can be reduced. According to one embodiment of the present invention, a transistor with favorable electrical characteristics can be achieved.

FIG. 19(C1) is a cross-sectional view in the channel length direction of a channel-etched transistor 825, which is a kind of bottom-gate transistor. In the transistor 825, the electrode 744a and the electrode 744b are formed without using the insulating layer 741. Thus, part of the semiconductor layer 742 that is exposed at the time of forming the electrode 744a and the electrode 744b is etched in some cases. Meanwhile, since the insulating layer 729 is not provided, the productivity of the transistor can be increased.

A transistor 826 illustrated in FIG. 19(C2) is different from the transistor 825 in that the electrode 723 that can function as a back gate electrode is provided over the insulating layer 729.

FIGS. 20(A1) to 20(C2) illustrate cross-sectional views in the channel width direction of the transistors 810, 811, 820, 821, 825, and 826, respectively.

In each of the structures illustrated in FIGS. 20(B2) and 20(C2), the gate electrode is connected to the back gate electrode, and the gate electrode and the back gate electrode have the same potential. In addition, the semiconductor layer 742 is sandwiched between the gate electrode and the back gate electrode.

The length in the channel width direction of each of the gate electrode and the back gate electrode is longer than the length in the channel width direction of the semiconductor layer 742. In the channel width direction, the whole of the semiconductor layer 742 is covered with the gate electrode or the back gate electrode with the insulating layers 726, 741, 728, and 729 sandwiched therebetween.

With the structure, the semiconductor layer 742 included in the transistor can be surrounded by electric fields of the gate electrode and the back gate electrode.

A device structure of a transistor, like that of the transistor 821 or the transistor 826, in which electric fields of a gate electrode and a back gate electrode electrically surround the semiconductor layer 742 where a channel region is formed can be referred to as a Surrounded channel (S-channel) structure.

With the S-channel structure, an electric field for inducing a channel can be effectively applied to the semiconductor layer 742 by one or both of the gate electrode and the back gate electrode, which enables improvement in the current drive capability of the transistor and high on-state current characteristics. In addition, since the on-state current can be increased, it is possible to scale down the transistor. Furthermore, with the S-channel structure, the mechanical strength of the transistor can be increased.

[Top-Gate Transistor]

A transistor 842 illustrated as an example in FIG. 21(A1) is a kind of top-gate transistor. The electrode 744*a* and the electrode 744*b* are electrically connected to the semiconductor layer 742 in opening portions formed in the insulating layer 728 and the insulating layer 729.

In addition, part of the insulating layer 726 that does not overlap with the electrode 746 is removed, and an impurity 755 is introduced into the semiconductor layer 742 using the electrode 746 and the remaining part of the insulating layer 726 as a mask, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than a region into which the impurity 755 is introduced without through the insulating layer 726. Thus, an LDD (Lightly Doped Drain) region is formed in a region of the semiconductor layer 742 that does not overlap with the electrode 746.

A transistor 843 illustrated in FIG. 21(A2) is different from the transistor 842 in that the electrode 723 is included. The transistor 843 includes the electrode 723 formed over the substrate 771. The electrode 723 has a region overlapping with the semiconductor layer 742 with the insulating layer 772 therebetween. The electrode 723 can function as a back gate electrode.

In addition, as in a transistor 844 illustrated in FIG. 21(B1) and a transistor 845 illustrated in FIG. 21(B2), the insulating layer 726 in a region that does not overlap with the electrode 746 may be completely removed. Furthermore, as in a transistor 846 illustrated in FIG. 21(C1) and a transistor 847 illustrated in FIG. 21(C2), the insulating layer 726 may be left.

Also in the transistor 842 to the transistor 847, the impurity 755 is introduced into the semiconductor layer 742 using the electrode 746 as a mask after the formation of the electrode 746, so that an impurity region can be formed in the semiconductor layer 742 in a self-aligned manner. According to one embodiment of the present invention, a transistor with favorable electrical characteristics can be achieved. Furthermore, according to one embodiment of the present invention, a semiconductor device having a high degree of integration can be achieved.

FIGS. 22(A1) to 22(C2) illustrate cross-sectional views in the channel width direction of the transistors 842, 843, 844, 845, 846, and 847, respectively.

The transistor 843, the transistor 845, and the transistor 847 each have the above-described S-channel structure; however, one embodiment of the present invention is not limited to this, and the transistor 843, the transistor 845, and the transistor 847 do not necessarily have the S-channel structure.

This embodiment can be implemented in an appropriate combination with the structures described in the other embodiments and the like.

Embodiment 4

Examples of electronic devices that can use the display device of one embodiment of the present invention include display devices, personal computers, image storage devices or image reproducing devices provided with storage media, cellular phones, game machines including portable game machines, portable information terminals, e-book terminals, cameras such as video cameras and digital still cameras, goggle-type displays (head-mounted displays), navigation systems, audio reproducing devices (car audio players, digital audio players, and the like), copiers, facsimiles, printers, multifunction printers, automated teller machines (ATM), and vending machines. Specific examples of these electronic devices are illustrated in FIG. 23.

Figure 23A:
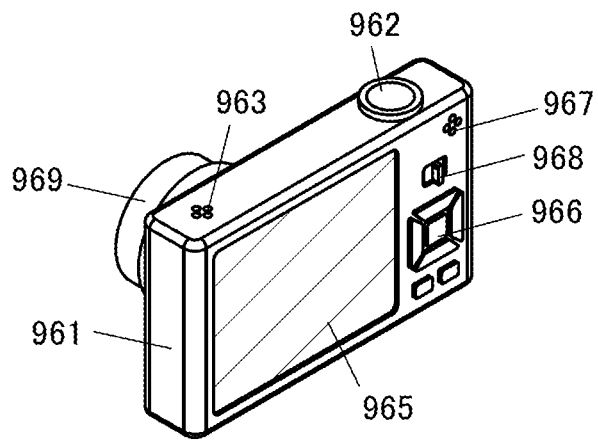
FIGS. 23A to 23F Diagrams illustrating electronic devices.

FIG. 23(A) is a digital camera, which includes a housing 961, a shutter button 962, a microphone 963, a speaker 967, a display portion 965, operation keys 966, a zoom lever 968, a lens 969, and the like. When the display device of one embodiment of the present invention is used for the display portion 965, a variety of images can be displayed.

Figure 23B:
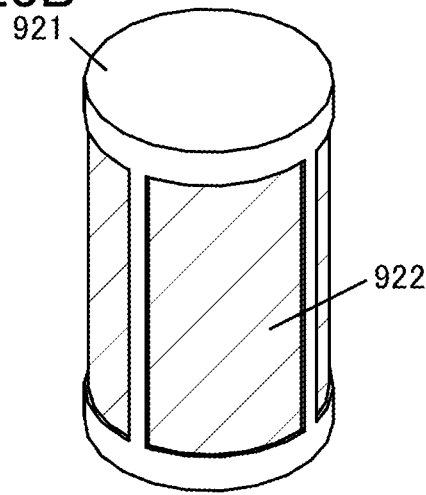

FIG. 23(B) is digital signage, which includes a large display portion 922. The digital signage can be installed on the side surface of a pillar 921, for example. When the display device of one embodiment of the present invention is used for the display portions 922, high-quality display can be performed.

Figure 23C:
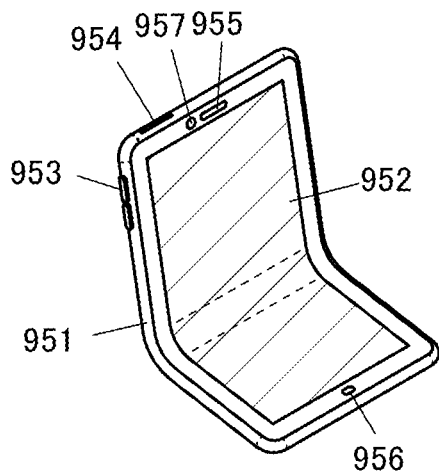

FIG. 23(C) is a cellular phone, which includes a housing 951, a display portion 952, an operation button 953, an external connection port 954, a speaker 955, a microphone 956, a camera 957, and the like. The display portion 952 of the cellular phone includes a touch sensor. A variety of operations such as making a call and inputting text can be performed by touch on the display portion 952 with a finger, a stylus, or the like. A housing 901 and the display portion 952 have flexibility and can be used in a bent state as shown in the figure. When the display device of one embodiment of the present invention is used for the display portion 952, a variety of images can be displayed.

Figure 23D:
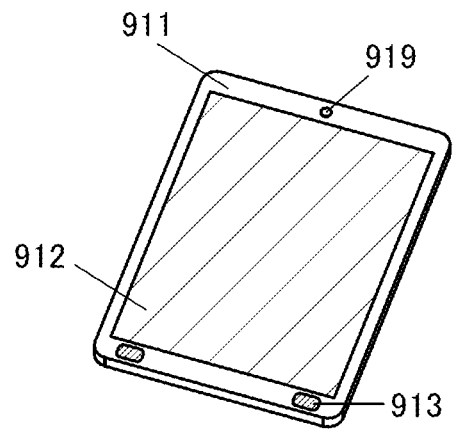

FIG. 23(D) is a portable information terminal, which includes a housing 911, a display portion 912, a speaker 913, a camera 919, and the like. Input and output of information can be performed by a touch panel function of the display portion 912. When the display device of one embodiment of the present invention is used for the display portion 912, a variety of images can be displayed.

Figure 23E:
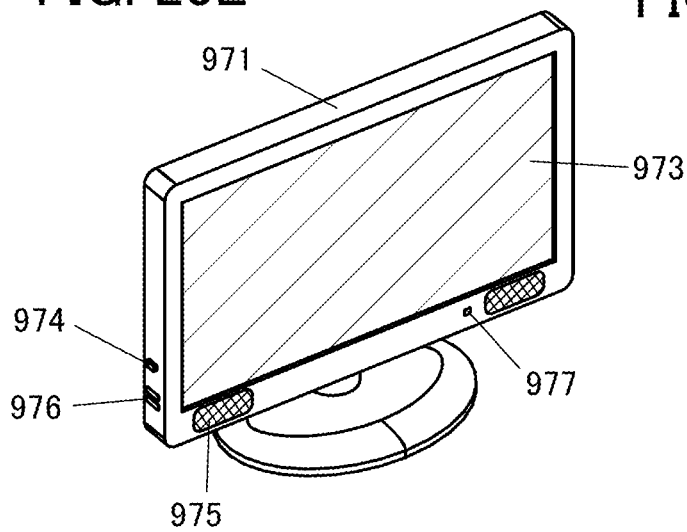

FIG. 23(E) is a television, which includes a housing 971, a display portion 973, an operation key 974, speakers 975, a communication connection terminal 976, an optical sensor 977, and the like. The display portion 973 is provided with a touch sensor, and input operation can also be performed. When the display device of one embodiment of the present invention is used for the display portion 973, a variety of images can be displayed.

Figure 23F:
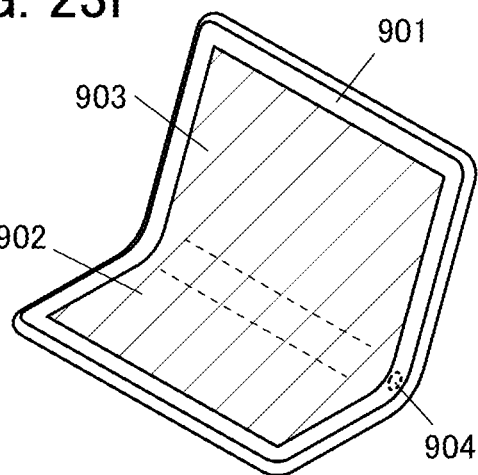

FIG. 23(F) is an information processing terminal, which includes the housing 901, a display portion 902, a display portion 903, a sensor 904, and the like. The display portion 902 and the display portion 903 are formed using one display panel and have flexibility. The housing 901 also has flexibility, can be used in a bent state as shown in the figure, and can also be used in a flat plate-like shape like a tablet terminal. The sensor 904 can sense the shape of the housing 901, and for example, it is possible to switch display on the display portion 902 and the display portion 903 when the housing is bent. When the display devices of one embodiment of the present invention are used for the display portion 902 and the display portion 903, a variety of images can be displayed.

This embodiment can be implemented in an appropriate combination with the structures described in the other embodiments and the like.

REFERENCE NUMERALS

10: pixel, 10B: subpixel, 10G: subpixel, 10R: subpixel, 11: pixel array, 12: row driver, 13: row driver, 14:

column driver, 15: column driver, 16: circuit, 17: selection circuit, 18: selection circuit, 19: selection circuit, 20: shift register, 21: buffer circuit, 22: shift register, 23: selection circuit, 25B: electrode, 25G: electrode, 25R: electrode, 101: transistor, 102: transistor, 103: capacitor, 110: circuit block, 111: transistor, 112: transistor, 113: capacitor, 114: EL element, 115: transistor, 116: capacitor, 117: liquid crystal element, 118: transistor, 119: transistor, 120: circuit, 121: wiring, 122: wiring, 124: wiring, 125: wiring, 126: wiring, 128: wiring, 129: wiring, 130: wiring, 131: wiring, 132: wiring, 133: wiring, 134: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 830: transistor, 840: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4005: sealant, 4006: substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: electrode layer, 4031: electrode layer, 4032: insulating layer, 4033: insulating layer, 4035: spacer, 4041: printed board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: partition, 4511: light-emitting layer, 4513: light-emitting element, and 4514: filler.

The invention claimed is:

1. A display device comprising:
a first transistor;
a first circuit;
a second circuit;
a third circuit;
a first wiring;
a second wiring; and
a third wiring,
wherein each of the first circuit, the second circuit, and the third circuit includes a second transistor, a first capacitor, and a display element,
wherein the second circuit further includes a third transistor and a second capacitor,
wherein, in each of the first circuit, the second circuit, and the third circuit, one of a source and a drain of the second transistor is electrically connected to one electrode of the first capacitor,
wherein, in each of the first circuit, the second circuit, and the third circuit, the one electrode of the first capacitor is electrically connected to the display element,
wherein the first wiring is electrically connected to the other of the source and the drain of the second transistor in the second circuit,
wherein the second wiring is electrically connected to the other of the source and the drain of the second transistor in the third circuit,
wherein the third wiring is electrically connected to one of a source and a drain of the first transistor which is provided outside of the first circuit, the second circuit, and the third circuit,
wherein the other of the source and the drain of the first transistor is electrically connected to the other electrode of the first capacitor in each of the first circuit, the second circuit, and the third circuit,
wherein a gate of the second transistor in the second circuit is electrically connected to a fourth wiring, and
wherein the one of the source and the drain of the second transistor in the second circuit is electrically connected to one of a source and a drain of the third transistor, the display element in the second circuit, and one electrode of the second capacitor.

2. A display device comprising:
a first transistor;
a first circuit;
a second circuit;
a third circuit;
a first wiring;
a second wiring; and
a third wiring,
wherein each of the first circuit, the second circuit, and the third circuit includes a second transistor, a first capacitor, and a display element,
wherein the second circuit further includes a third transistor and a second capacitor,
wherein, in each of the first circuit, the second circuit, and the third circuit, one of a source and a drain of the second transistor is electrically connected to one electrode of the first capacitor,
wherein, in each of the first circuit, the second circuit, and the third circuit, the one electrode of the first capacitor is electrically connected to the display element,
wherein the first wiring is electrically connected to the other of the source and the drain of the second transistor in the second circuit,
wherein the second wiring is electrically connected to the other of the source and the drain of the second transistor in the third circuit,
wherein the third wiring is electrically connected to one of a source and a drain of the first transistor which is provided outside of the first circuit, the second circuit, and the third circuit,
wherein the other of the source and the drain of the first transistor is electrically connected to the other electrode of the first capacitor in each of the first circuit, the second circuit, and the third circuit,
wherein a gate of the second transistor in the second circuit is electrically connected to a fourth wiring,
wherein the one of the source and the drain of the second transistor in the second circuit is electrically connected to one of a source and a drain of the third transistor, the display element in the second circuit, and one electrode of the second capacitor, and wherein the other electrode of the second capacitor is electrically connected to a fifth wiring.

3. A display device comprising:

a first transistor;

a first circuit;

a second circuit;

a third circuit;

a first wiring;

a second wiring; and a third wiring, wherein each of the first circuit, the second circuit, and the third circuit includes a second transistor, a first capacitor, and a display element, wherein the second circuit further includes a third transistor and a second capacitor, wherein, in each of the first circuit, the second circuit, and the third circuit, one of a source and a drain of the second transistor is electrically connected to one electrode of the first capacitor, wherein, in each of the first circuit, the second circuit, and the third circuit, the one electrode of the first capacitor is electrically connected to the display element, wherein the first wiring is electrically connected to the other of the source and the drain of the second transistor in the second circuit, wherein the second wiring is electrically connected to the other of the source and the drain of the second transistor in the third circuit, wherein the third wiring is electrically connected to one of a source and a drain of the first transistor which is provided outside of the first circuit, the second circuit, and the third circuit, wherein the other of the source and the drain of the first transistor is electrically connected to the other electrode of the first capacitor in each of the first circuit, the second circuit, and the third circuit, wherein a gate of the second transistor in the second circuit is electrically connected to a fourth wiring, wherein the one of the source and the drain of the second transistor in the second circuit is electrically connected to one of a source and a drain of the third transistor, the display element in the second circuit, and one electrode of the second capacitor, and wherein the first transistor is not provided in a signal line driver circuit and a scan line driver circuit.

* * * * *